United States Patent
Kwon et al.

(10) Patent No.: US 11,908,758 B2
(45) Date of Patent: Feb. 20, 2024

(54) SEMICONDUCTOR PACKAGE INCLUDING DUAL STIFFENER

(71) Applicant: SAMSUNG ELECTRONICS CO., LTD., Suwon-si (KR)

(72) Inventors: Heungkyu Kwon, Seongnam-si (KR); Junso Pak, Seongnam-si (KR); Heeseok Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 17/550,284

(22) Filed: Dec. 14, 2021

(65) Prior Publication Data

US 2022/0208624 A1    Jun. 30, 2022

(30) Foreign Application Priority Data

Dec. 29, 2020   (KR) .................. 10-2020-0186783
Jun. 10, 2021   (KR) .................. 10-2021-0075635

(51) Int. Cl.
*H01L 23/16*   (2006.01)
*H01L 23/053*  (2006.01)
*H01L 23/31*   (2006.01)

(52) U.S. Cl.
CPC ............ *H01L 23/16* (2013.01); *H01L 23/053* (2013.01); *H01L 23/31* (2013.01)

(58) Field of Classification Search
CPC ........ H01L 23/16; H01L 23/053; H01L 23/31
See application file for complete search history.

(56) References Cited

U.S. PATENT DOCUMENTS

| | | | |
|---|---|---|---|
| 8,093,722 B2 | 1/2012 | Chen et al. | |
| 9,252,054 B2 | 2/2016 | Wu et al. | |
| 9,418,909 B1 | 8/2016 | Chaware et al. | |
| 9,748,184 B2 | 8/2017 | Shih et al. | |
| 9,793,187 B2 | 10/2017 | Lin et al. | |
| 10,475,741 B2 | 11/2019 | Fu et al. | |
| 10,764,996 B1 | 9/2020 | Boja et al. | |
| 2006/0237843 A1* | 10/2006 | Yanaka | H01L 23/49838 257/E23.07 |
| 2017/0352612 A1* | 12/2017 | Sung | H01L 21/486 |
| 2019/0115269 A1 | 4/2019 | Chen et al. | |
| 2019/0148260 A1* | 5/2019 | Sikka | H01L 23/3675 257/713 |
| 2019/0311963 A1* | 10/2019 | Christianson | H01P 3/081 |

* cited by examiner

*Primary Examiner* — Peniel M Gumedzoe
(74) *Attorney, Agent, or Firm* — Fish & Richardson P.C.

(57) ABSTRACT

A semiconductor package includes; a dual stiffener including an upper stiffener and a lower stiffener, an upper package including an upper package substrate, a semiconductor chip centrally mounted on an upper surface of the upper package substrate, and the upper stiffener disposed along an outer edge of the upper package substrate, and a lower package substrate that centrally mounts the upper package and includes the lower stiffener disposed on an upper surface of the lower package substrate to surround the upper package substrate.

18 Claims, 27 Drawing Sheets

SEMICONDUCTOR PACKAGE INCLUDING DUAL STIFFENER

CROSS-REFERENCE TO RELATED APPLICATIONS

This application claims the benefit of Korean Patent Application No. 2020-0186783 filed on Dec. 29, 2020 and Korean Patent Application No. 10-2021-0075635 filed on Jun. 10, 2021, the collectively subject matter of which is hereby incorporated by reference in its entirety.

BACKGROUND

The inventive concept relates generally to semiconductor packages, and more particularly to semiconductor packages including a stiffener.

A semiconductor package is essentially a manufactured component having a form that enables a semiconductor chip to be mounted (e.g., mechanically assembled and/or electrically connected) and usefully accessed within an electronic product. For example, within the semiconductor package, the semiconductor chip may be mounted on a printed circuit board (PCB) using conductive bonding wires and/or bumps. As the semiconductor chip(s) and related components within a semiconductor package operate at higher speeds and at greater data capacities, power consumption by the semiconductor package increases. Accordingly, the structure of the semiconductor package and its related components has become an increasingly important consideration in ongoing efforts to manage the physical size and layout, electrical performance, thermal characteristics, and/or power supplies of contemporary and emerging semiconductor packages.

SUMMARY

Embodiments of the inventive concept relate to relatively low-cost semiconductor packages exhibiting enhanced electrical performance and improved thermal characteristics.

According to an aspect of the inventive concept, a semiconductor package includes; a dual stiffener including an upper stiffener and a lower stiffener, an upper package including an upper package substrate, a semiconductor chip centrally mounted on an upper surface of the upper package substrate, and the upper stiffener disposed along an outer edge of the upper package substrate, and a lower package substrate that centrally mounts the upper package and includes the lower stiffener disposed on an upper surface of the lower package substrate to surround the upper package substrate.

According to an aspect of the inventive concept, a semiconductor package includes; a dual stiffener including an upper stiffener and a lower stiffener, an upper package including an upper package substrate, a system on chip (SoC) centrally mounted on an upper surface of the upper package substrate using an upper ball grid array (BGA), and the upper stiffener disposed along an outer edge of the upper package substrate, a lower package substrate that centrally mounts the upper package using a second BGA and includes the lower stiffener disposed on an upper surface of the lower package substrate to surround the upper package substrate, and a heat sink disposed on the upper package.

According to an aspect of the inventive concept, a semiconductor package includes; a dual stiffener including an upper stiffener and a lower stiffener, an upper package including an upper package substrate, a semiconductor chip centrally mounted on an upper surface of the upper package substrate, and the upper stiffener disposed along an outer edge of the upper package substrate, a lower package substrate that centrally mounts the upper package and includes the lower stiffener disposed on an upper surface of the lower package substrate to surround the upper package substrate, and a heat sink disposed on the upper package and including a lower surface thermally contacting an upper surface of the semiconductor chip, wherein the upper stiffener is a square-ring having a rectangular cross-section, and the lower stiffener is a square-ring and includes a fence portion having a rectangular cross-section and a cover portion extending horizontally from an upper surface of the fence portion to contact an upper surface of the upper stiffener.

BRIEF DESCRIPTION OF THE DRAWINGS

The making and use of the inventive concept may be more clearly understood upon consideration of the following detailed description taken in conjunction with the accompanying drawings in which:

FIGS. 1A to 1C illustrate a semiconductor package including a dual stiffener according to embodiments of the inventive concept;

FIGS. 2A and 2B illustrate a semiconductor package including a dual stiffener according to embodiments of the inventive concept;

FIGS. 6A and 6B illustrate a semiconductor package including a dual stiffener according to embodiments of the inventive concept;

FIGS. 2A and 2B illustrate a semiconductor package including a dual stiffener according to embodiments of the inventive concept;

DETAILED DESCRIPTION

Embodiments of the inventive concept will be described in some additional detail hereafter with reference to the accompanying drawings. Throughout the written description and drawings, like reference numbers and labels are used to denote like or similar elements, components and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
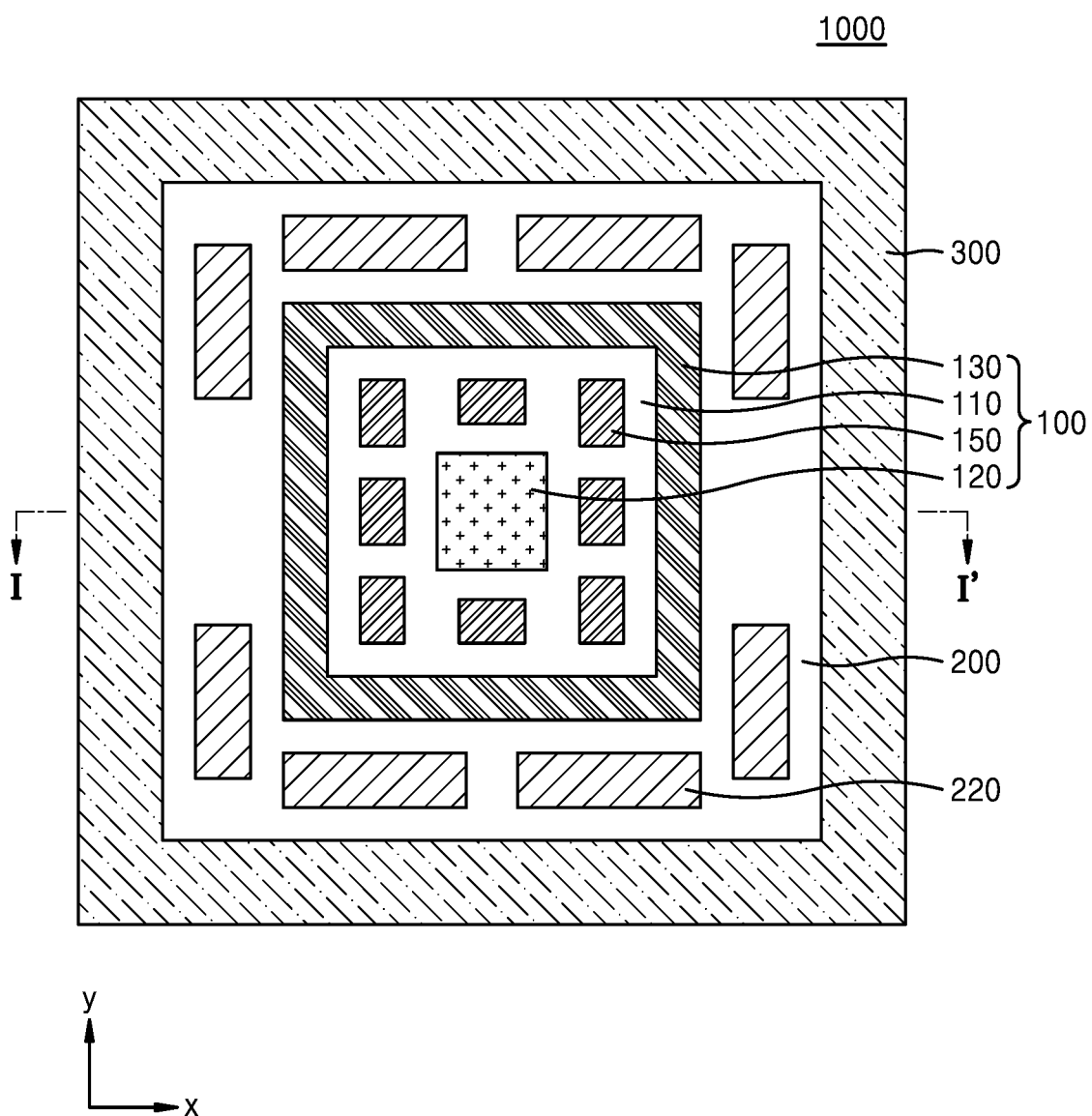
FIG. 1A is a plan (or top-down) view.
Figure 1B:
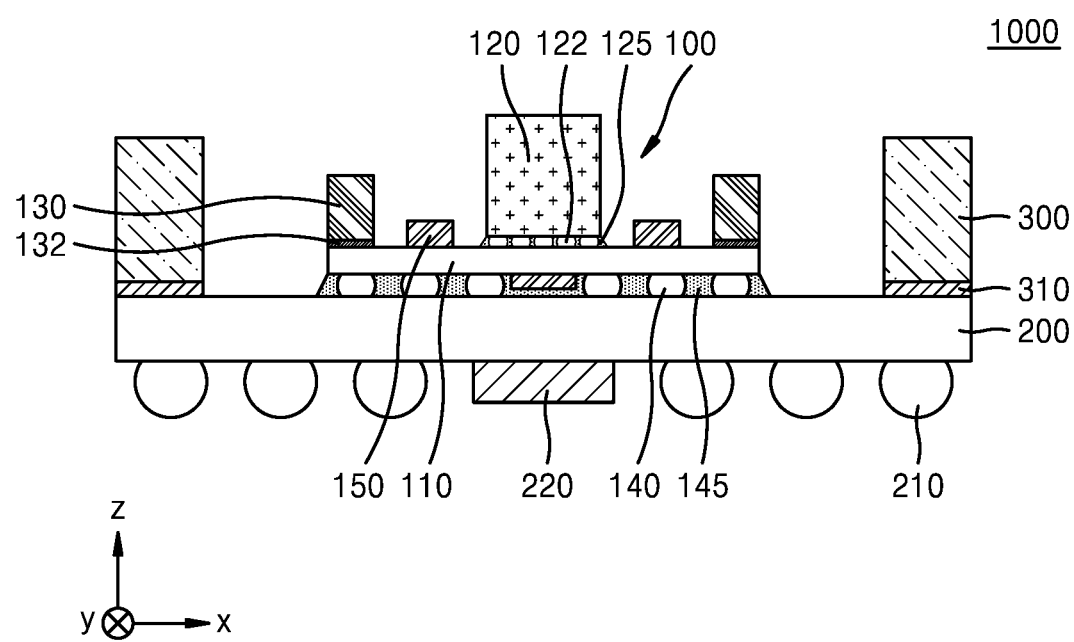
FIG. 1B is a cross-sectional view.
Figure 1C:
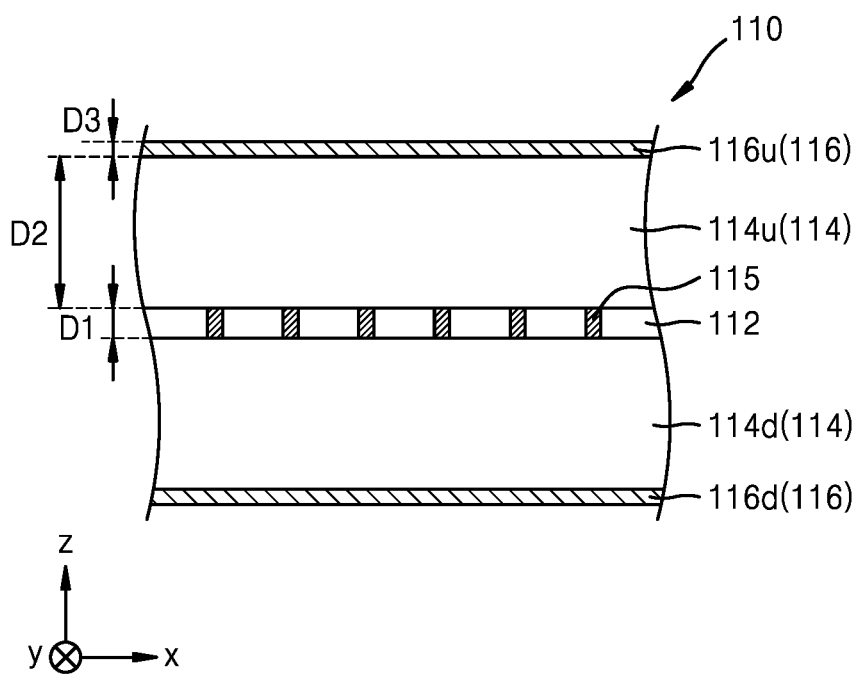
FIG. 1C is an enlarged, partial view; collectively

FIG. 1A is a plan view, FIG. 1B is a cross-sectional view taken along the line I-I' of FIG. 1A, and FIG. 1C is a partial enlarged view of a portion of an upper package substrate of FIG. 1B. Collectively, FIGS. 1A to 1C illustrate a semiconductor package 1000 according to embodiments of the inventive concept.

Referring to FIGS. 1A to 1C, the semiconductor package 1000 may include an upper package 100, a lower package substrate 200, and a lower stiffener 300. In this regard, the upper package 100 may include an upper package substrate 110, a first semiconductor chip 120, an upper stiffener 130, first connection members 140, and various upper-level passive elements 150.

The upper package substrate 110 may be, for example, a printed circuit board (PCB). The upper package substrate 110 may be mounted on the lower package substrate 200 using the first connection members 140. The upper package substrate 110 may include a core layer 112, a wiring unit 114 and a solder resist (SR) layer 116. (See, e.g., FIG. 1C). In some embodiments, a lateral (or horizontal) "area" of the upper package substrate 110 (e.g., as measured in terms of a first horizontal, or X direction and a second horizontal, or Y direction) may be no greater than about 2500 mm$^2$ (e.g., about 50 mm×50 mm).

In some embodiments, the core layer 112 may include glass fiber and resin such as FR4. Alternately, the core layer 112 may include a build-up film such as bismaleimide-triazine (BT) resin, poly carbonate (PC) resin, Ajinomoto build-up film (ABF) and/or laminate resin.

However, specifically implemented, the core layer 112 should have a relatively small "thickness" (e.g., as measured in a vertical, or Z direction relative to an arbitrarily selected horizontal plane, such as the upper surface of the lower package substrate 200). For example, the core layer 112 may have a first thickness D1 through which stack vias may be readily formed to connect upper and lower surfaces of the core layer 112. In some embodiments, the first thickness D1 may range from between about 0 μm to about 200 μm, and more particularly, in some embodiments the first thickness D1 may range from between about 40 μm to about 100 μm. However, in some embodiments, the upper package substrate 110 may entirely omit the core layer 112.

The wiring unit 114 may be variously configured. For example, in some embodiments, the wiring unit 114 may include an upper wiring unit 114$u$ and a lower wiring unit 114$d$, as shown in FIG. 1C. Each of the upper wiring unit 114$u$ and the lower wiring unit 114$d$ may include one or more wiring layers. The number of wiring layers for the upper wiring unit 114$u$ and the number of wiring layers for the lower wiring unit 114$d$ may independently vary according to design. For example, in some embodiments, the number of wiring layers within the wiring unit 114 may range from 8 to 14.

In one particular embodiment, the wiring unit 114 may include 4 wiring layers for the upper wiring unit 114$u$ and an additional 4 wiring layers for the lower wiring unit 114$d$. Further, within the context of this more particular embodiment, the upper wiring unit 114$u$ may be implemented as a P-G-S-G wiring layer and the lower wiring unit 114$d$ may be implemented as a S-G-P-G wiring layer, wherein 'P' denotes a power wiring layer, 'G' denotes a ground wiring layer, and 'S' denotes a signal wiring layer.

Here, the thickness of the wiring unit 114 will vary according to the number of wiring layers. However, in some embodiments, the thickness of the wiring unit 114 may range from about 100 μm to 1,000 μm. In this regard, assuming in one example that the wiring unit 114 includes 8 wiring layers, the wiring unit 114 may have a thickness of about 500 μm. That is, each of the upper wiring unit 114$u$ and the lower wiring unit 114$d$ may have a second thickness D2 of about 250 μm.

The wiring unit 114 may include metal wiring lines respectively corresponding to the wiring layers and interlayer insulating layers electrically insulating the metal wiring lines. Metal vias may be selectively used to interconnect the metal wiring lines. The metal wiring lines and/or the metal vias may include one or more conductive materials, such as copper (Cu), and the interlayer insulating layers may include one or more insulating materials such as polypropylene glycol (PPG).

In this regard, a particular materials choice for the interlayer insulating layer(s) may motivate a corresponding materials choice for the upper package substrate 110. For example, assuming the interlayer insulating layers include PPG, the upper package substrate 110 may be a thin-core PPG PCB.

The SR layer 116 may be used to protect the core layer 112 and the wiring unit 114 from mechanical impact, scratching, contamination and/or chemical damage. As shown in FIG. 1C, the SR layer 116 may include an upper SR layer 116$u$ disposed on the upper wiring unit 114$u$ and a lower SR layer 116$d$ disposed on the lower wiring unit 114$d$. In some embodiments, one or both of the upper SR layer 116$u$ and the lower SR layer 116$d$ may have a third thickness D3 of about 20 μm.

It should be noted at this point that those skilled in the art will appreciate that the upper package substrate 110 may be variously implemented in view of the foregoing examples.

The first semiconductor chip 120 may be mounted on the upper package substrate 110 through fine connection members 122 (e.g., fine bumps) using a flip-chip method. That is, the first semiconductor chip 120 may be "flip-chip mounted" on the upper package substrate 110 using the fine connection members 122. Alternately, the first semiconductor chip 120 may be mounted on the upper package substrate 110 using a wire bonding method.

Here, the size (e.g., the diameter) of the fine connection members 122 may be less than the size of the first connection members 140. However, the structure and material(s) of the fine connection members 122 may be the same as those of the first connection members 140.

In some embodiments such as the one illustrated in FIG. 1A, the first semiconductor chip 120 may be "centrally mounted" on the upper package substrate 110 (e.g., mounted on or near a center of the upper package substrate 100).

One or more materials constituting an upper underfill layer 125 may disposed (e.g., injected or otherwise in-filled) between the first semiconductor chip 120 and the upper package substrate 110 to substantially surround the fine connection members 122.

In some embodiments, the first semiconductor chip 120 may be a system on chip (SoC) or a logic chip. Here, the term "logic chip" denotes at least one of an application processor (AP), a micro-processor, a central processing unit (CPU), a controller, and an application specific integrated circuit (ASIC).

In some embodiments, the first semiconductor chip 120 may be a SoC including two or more integrated circuits such as a logic circuit, a memory circuit, a digital integrated circuit (IC), a radio frequency IC (RFIC), an input and output (I/O) circuit, etc. In some embodiments, the first semiconductor chip 120 may be a SoC implementing an advanced Reduced Instruction Set Computer (RISC) machine (or ARM) including a dynamic random access memory (DRAM) interface for a dual in-line memory module (DIMM), a peripheral component interconnect express (PCIe) interface functioning as a switch, and a CPU.

In some embodiments, the first semiconductor chip 120 may have a thickness that ranges from about 200 μm to about 800 μm. In this regard it should be further noted that a significant portion of the thermal energy (or heat) exhausted by the semiconductor package 1000 may be generated in relation to the upper package 100 (i.e., by the first semiconductor chip 120).

In some embodiments, the upper stiffener 130 may have a shape and be disposed on the upper package substrate 110 so as to substantially surround the outer perimeter of the upper package substrate 110. For example, as shown illustrated in FIG. 1A, the upper stiffener 130 may have a rectilinear shape (e.g., a "square-ring") substantially surrounding the centrally disposed first semiconductor chip 120. Further, in some embodiments, the upper stiffener 130 may have a rectangular (e.g., a square-shaped or rectangular-shaped) cross-section. In some embodiments, this rectangular cross-section may resemble an I-shape.

However, specifically shaped and disposed on the upper package substrate 110, the upper stiffener 130 may improve the mechanical stability and thermal-response characteristics of the semiconductor package 1000 (e.g., improved warp-resistance of the upper package substrate 110) by supporting the upper package substrate 110.

In this regard in some embodiments, the upper stiffener 130 may include one or more metal(s) such as steel or Cu. For example, the upper stiffener 130 may be fixed to the upper package substrate 110 using a first adhesive layer 132. In some embodiments, an upper surface of the upper stiffener 130 may be disposed at a "level" (e.g., measured in the vertical or Z direction) that is lower than an upper surface of the first semiconductor chip 120. Alternately, the upper surface of the upper stiffener 130 may have a same level as the level of the upper surface of the first semiconductor chip 120. Alternately, the upper surface of the upper stiffener 130 may have a level disposed higher than the level of the upper surface of the first semiconductor chip 120.

The first connection members 140 may be variously implemented as (e.g.) solder balls, solder bumps, a combination of pillars and solder balls, a combination of pads and solder balls, etc. In some embodiments, respective solder balls may have a substantially spherical shape, wherein the solder balls include (e.g.) at least one of tin (Sn), indium (In), bismuth (Bi), antimony (Sb), Cu, silver (Ag), zinc (Zn) and lead (Pb), and the pillars may be substantially circular, cylindrical or square in cross-section may include at least one of nickel (Ni), Cu, palladium (Pd), platinum (Pt) and gold (Au).

As shown in FIG. 1B, the first connection members 140 may be variously arranged on a lower surface of the upper package substrate 110 (e.g., in an array structure). In some embodiments, the first connection members 140 may have a pitch no greater than 0.8 mm, and more particularly may have a pitch of about 0.5 mm.

In some embodiments, an array structure associated with the combination of the solder balls and the upper package substrate 110 may be referred to as a ball grid array (BGA). A lower underfill layer 145 may be disposed between the first semiconductor chip 120 and the upper package substrate 110 to substantially surround the first connection members 140.

The upper-level passive elements 150 (e.g., inductor(s), resistor(s) and/or capacitor(s)) may be variously arranged on the upper surface and/or the lower surface of the upper package substrate 110. As shown in FIG. 1A, the upper-level passive elements 150 disposed on the upper surface of the upper package substrate 110 may be variously arranged around the perimeter of the first semiconductor chip 120 within the circumference of the upper stiffener 130 surrounding the first semiconductor chip 120. Alternately or additionally, other upper-level passive elements 150 may be variously arranged on the lower surface of the upper package substrate 110 (e.g., arranged in a more central portion of the lower surface of the upper package substrate 110.

The upper package 100 may be mounted on the lower package substrate 200. For example, consistent with the foregoing description, the upper package 100 may be centrally mounted on the lower package substrate 200 using the first connection members 140. In this regard in some embodiments, the lower package substrate 200 may be similar in composition to the upper package substrate 110. In some embodiments, the lateral area occupied by the lower package substrate 200 may no greater than 10,000 mm² (e.g., 100 mm×100 mm). Thus, extending this descriptive example in relation to the previous description of the upper package substrate 110, in some embodiments, the lateral area occupied by the lower package substrate 200 may be about four times (4X) that of the lateral area of the upper package substrate 110.

Analogous to the upper package substrate 110, the lower package substrate 200 may include a core layer, a wiring unit and an SR layer, wherein the core layer, the wiring unit, and the SR layer of the lower package substrate 200 are substantially the same as those described in relation to the core layer 112, the wiring unit 114, and the SR layer 116 of the upper package substrate 110. However, the respective thickness(es) of the core layer, the wiring unit, and the SR layer of the lower package substrate 200 may be relatively greater than thickness(es) for the core layer 112, the wiring unit 114, and the SR layer 116 of the upper package substrate 110. In addition, the number of wiring layers of the wiring unit of the lower package substrate 200 may be greater than the number of wiring layers of the wiring unit 114 of the upper package substrate 110.

In some embodiment, the lower package substrate 200 may be a thin core, high-density interconnect (HDI) PCB.

Second connection members 210 may be arranged on a lower surface of the lower package substrate 200 to form an array structure. Here, the materials composition and structure of the second connection members 210 may be substantially similar to those of the first connection members 140. However, the pitch of the second connection members 210 may be greater than the pitch of the first connection members 140. For example, the second connection members 210 may have a pitch that ranges from about 0.8 mm to about 1.3 mm, and in some embodiments the pitch of the second connection members 210 may be about 1.0 mm.

Lower-level passive elements 220 may be variously arranged on the upper surface and/or the lower surface of the lower package substrate 200. As shown in FIG. 1A, the lower-level passive elements 220 may be variously arranged on the upper surface of the lower package substrate 200 around the lower package substrate 200 by within the perimeter of the lower stiffener 300. Alternately or additionally, other lower-level passive elements 220 may be variously arranged in a more central portion of the lower surface of the lower package substrate 200.

The lower stiffener 300 may be disposed on the upper surface of the lower package substrate 200 to substantially in alignment with outer edge portions of the lower package substrate 200. As shown in FIG. 1A, the lower stiffener 300 may have square-ring shape that substantially surrounds the upper package 100 which is centrally disposed on the lower package substrate 200. Further, in some embodiments, the lower stiffener 300 may have a rectangular cross-section. Analogous to the upper stiffener 130, the lower stiffener 300 may improve the mechanical stability and thermal-response characteristics of the lower package substrate 200 by mechanically supporting the lower package substrate 200.

Thus, in some embodiments, the lower stiffener 300 may include one or more metal(s) such as steel or Cu. The lower stiffener 300 may be fixed to the lower package substrate 200 using a first adhesive layer 310. Here, an upper surface of the lower stiffener 300 may be disposed at a level that is lower than, higher than, or about the same as the upper surface of the first semiconductor chip 120.

In this regard, various embodiments including the upper stiffener 130 and/or the lower stiffener 300 having variable upper surface levels will be described in some additional detail with reference to FIGS. 4A to 4E.

From the foregoing those skilled in the art will appreciate that embodiments of the inventive concept, like the semiconductor package 1000 of FIGS. 1A to 1C, may include the upper package substrate 110 vertically stacked on the lower package substrate 200, wherein each of the upper package substrate 110 and the lower package substrate 200 may include a thin core layer and a wiring layer including relatively few wiring layers. Accordingly, problems associated with conventional semiconductor packages, comparatively characterized by relatively thick core layer(s), numerous wiring layers and/or relatively large through vias, do not arise in relation to embodiments of the inventive concept.

That is, conventional semiconductor packages including a SoC for a server—in order to cope with increasing size and/or performance requirements associated with the SoC—semiconductor chips flip-chip mounted on a package substrate often occupy a lateral area equal or exceeding 100 mm×100 mm, include a core layer having a thickness no less than 800 μm, and further include 14 to 22 wiring layers. In addition, a large-sized drill via caused by the thick core layer and the ABF may be used. Therefore, conventional semiconductor packages are manifestly disadvantageous in terms of manufacturing cost and provide package substrates exhibiting relatively poor power/signal integrity PI/SI characteristics. Further, it is often impossible to dispose an embedded capacitor(s) (eCAP) in relation to the thicker core layers, and when land-side capacitor(s) (LSC) is applied, the CAP application effect deteriorates due to increasing inductance. The package substrate of the conventional semiconductor package may correspond to a thick core ABF PCB.

In great contrast, embodiments of the inventive concept fully address these and other problems by using two relatively thin package substrates. For example, as described above, the semiconductor package 1000 including the lower package substrate 200 and the upper package substrate 110 has a structure in which the first semiconductor chip 120 as the SoC is flip-chip mounted on the upper package substrate 110. Each of the lower package substrate 200 and the upper package substrate 110 includes a thin core layer (or not) and 8 to 12 wiring layers. This configuration yields a small-sized stacked structure including relatively small though vias. Therefore, embodiments of the inventive concept reduce overall manufacturing cost and provide package substrates exhibiting improved power/signal integrity PI/SI characteristics.

In some embodiments, the upper package substrate 110 may have a size of about 50 mm×50 mm, such that a ¼ sized mobile PCB may be used. As a result, manufacturing cost may be reduced. The lower package substrate 200 has a somewhat larger size of about 100 mm×100 mm, a pitch of no less than 0.8 mm, a thin core layer, and a small number of wiring layers, such that manufacturing costs are reduced in relation to looser design rule(s) associated with (DR) HDI PCB. Furthermore, because capacitors, such as the eCAP/LSC, may be readily applied to the lower package substrate 200 and/or the upper package substrate 110, the corresponding SI characteristics may improve.

Alternately or additionally, the semiconductor package 1000 of FIGS. 1A to 1C also includes a dual stiffener (e.g., a combination of the upper stiffener 130 and the lower stiffener 300). For example, the semiconductor package 1000 may include the upper stiffener 130 disposed on the upper package substrate 110 and the lower stiffener 300 disposed on the lower package substrate 200. As described above, by including the dual stiffener, the mechanical stability and thermal-response characteristics of the semiconductor package (e.g., warpage characteristics for the upper package substrate 110 and/or the lower package substrate 200) are improved.

Additionally of note, the semiconductor package 1000 provides an accessible upper surface of a first semiconductor chip 120 capable of directly contacting a lower surface of an optionally provided heat sink. (See, e.g., FIG. 4A). In this regard, a thermal interface material (TIM) layer may be used to improve thermal-transfer characteristics associated with the first semiconductor 120. (See. e.g., FIGS. 4A to 4E, and FIGS. 5A to 5C).

Figure 2A:
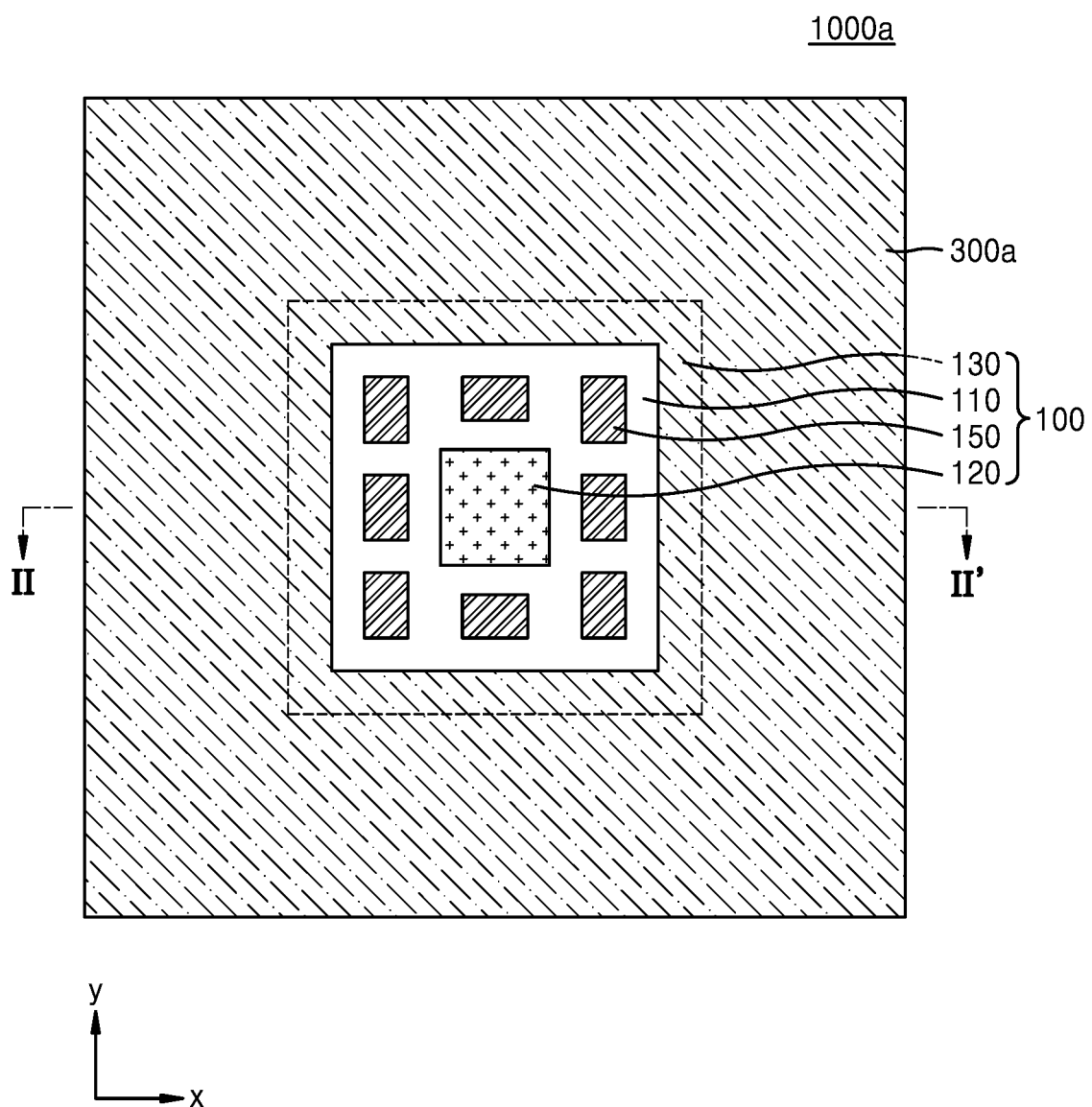
FIG. 2A is a plan view and FIG. 2B is a cross-sectional view; collectively
Figure 2B:
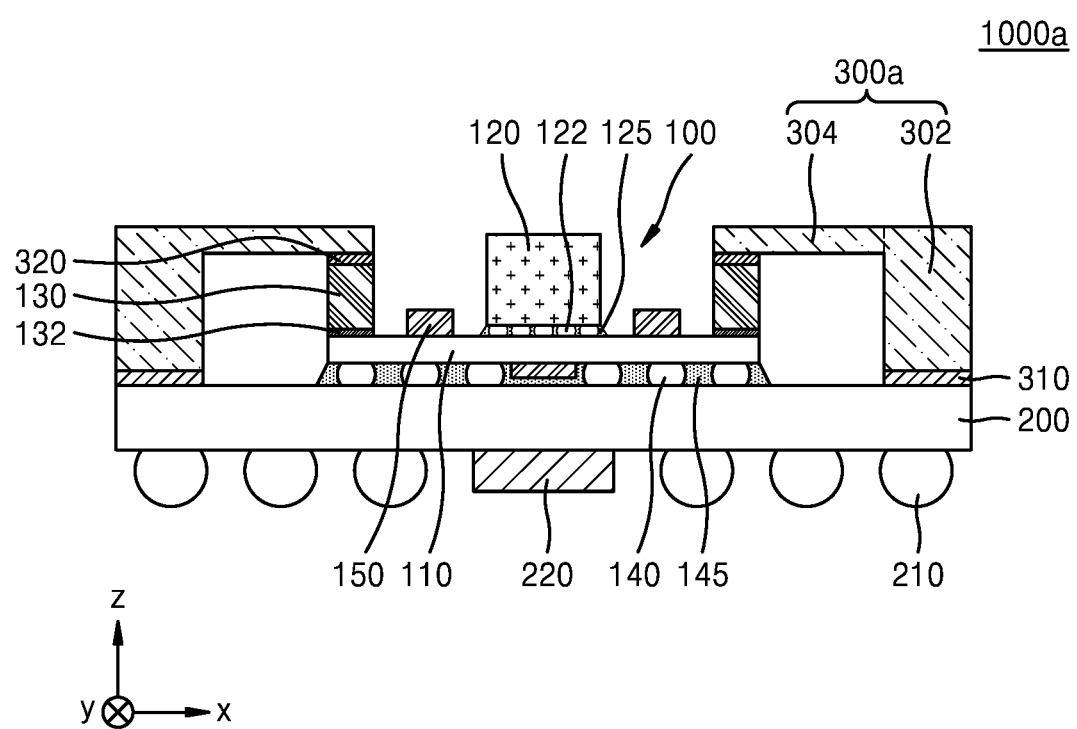

FIG. 2A is a plan view of a semiconductor package 1000a according to embodiments of the inventive concept, and FIG. 2B is a cross-sectional view taken along the line II-IT' of FIG. 2A. Only materials differences between previously presented embodiments (e.g., FIGS. 1A to 1C) will be highlighted.

Referring to FIGS. 2A and 2B, the semiconductor package 1000a includes a lower stiffener 300a that differs in shape and disposition relative to the lower stiffener 300 of FIG. 1A. That is, the semiconductor package 1000a may include the upper package 100, the upper stiffener 130, the lower package substrate 200, and the lower stiffener 300a, wherein the upper package 100 and the lower package substrate 200 may be substantially similar to the description provided in relation to FIGS. 1A to 1C.

Here, the lower stiffener 300a may again be disposed substantially in alignment with the outer edge portions of the lower package substrate 200. However, as shown in FIGS. 2A and 2B, the lower stiffener 300a may include a rectangular-shaped fence portion 302 capped by a horizontally extending cover portion 304. Thus, a cross-section of the lower stiffener 300a may resemble a "toppled L-shape" (e.g., an '¬' shape). Like the lower stiffener 300 of FIG. 1A, the fence portion 302 may have a square-ring shape that substantially surrounds the upper package 100. However, the cover portion 304 may extend horizontally and inwardly from an upper surface (or top) of the fence portion 302 to contact at least part of the upper surface (or top) of the upper stiffener 130. In some embodiments, at least an inwardly-disposed portion of a lower surface of the cover portion 304 may be fixed to the upper surface of the upper stiffener 130 using a second adhesive layer 320. That is, the upper stiffener 130 may be mechanically connected with the lower stiffener 300 through the cover portion 304 to form a first particularly-configured dual stiffener. With this first particularly-configured dual stiffener, the semiconductor package 1000a exhibits improved mechanical stability and thermal-response characteristics (e.g., improved warpage characteristics for the upper package substrate 110 and/or the lower package substrate 200).

Figure 3A:
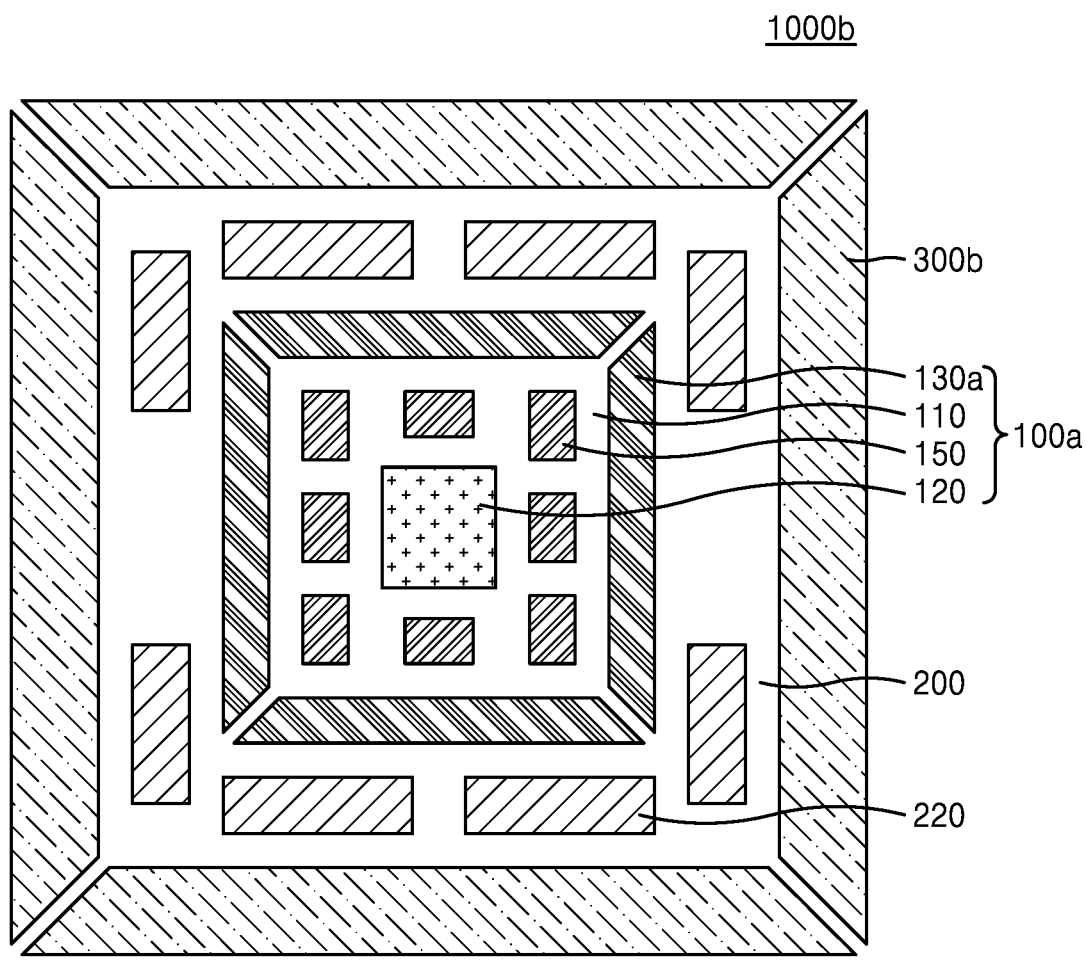
FIGS. 3A and 3B are respective plan views of semiconductor packages including dual stiffeners according to embodiments of the inventive concept.
Figure 3B:
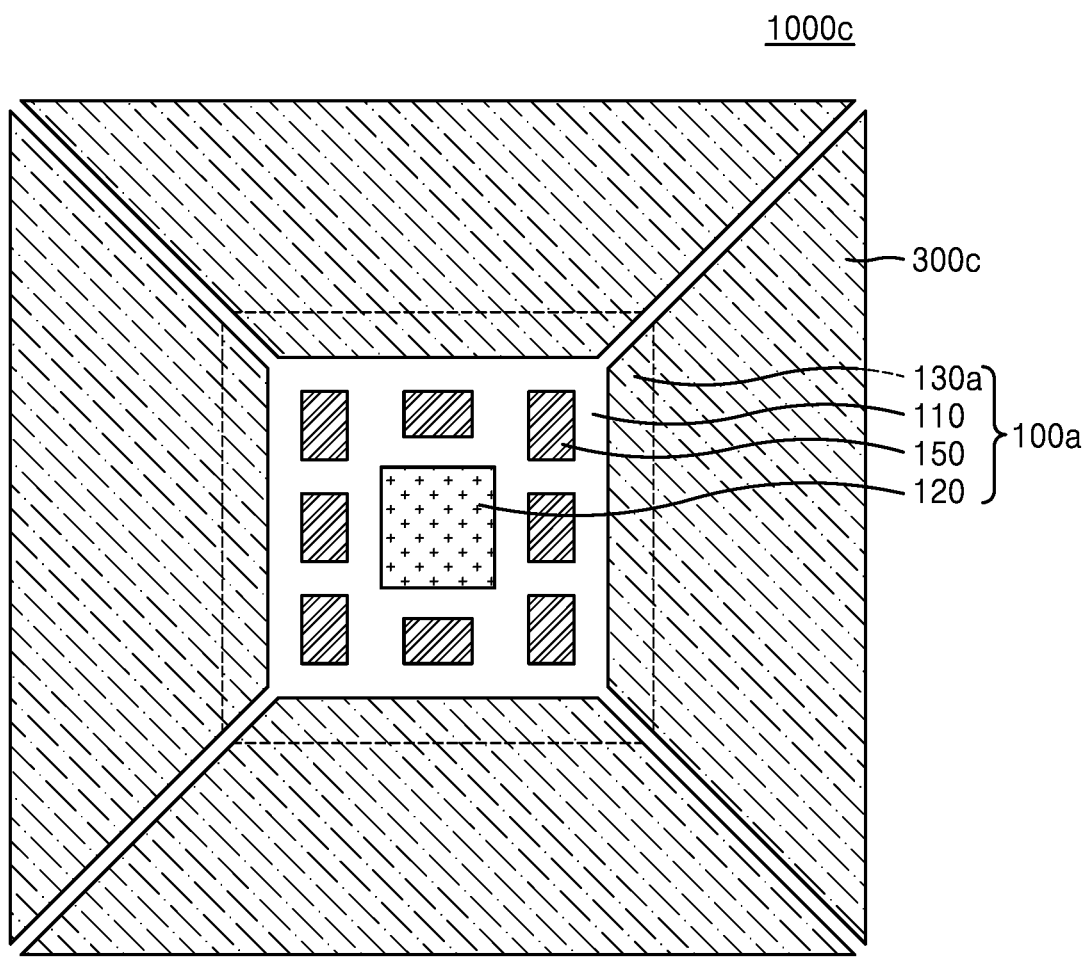

FIGS. 3A and 3B are respective plan views of semiconductor packages 1000b and 1000c according to embodiments of the inventive concept. Only materials differences between previously presented embodiments (e.g., FIGS. 1A to 1C, 2A and 2B) will be highlighted.

Referring to FIG. 3A, the semiconductor package 1000b includes a rectangular arrangement of (multiple) upper stiffeners 130a and a rectangular arrangement of (multiple) lower stiffeners 300b. That is, instead of the unitary (e.g., single piece) upper stiffener and the unitary lower stiffener described in relation to FIGS. 1A to 1C, 2A and 2B, the embodiments of FIGS. 3A and 3B may include respective, rectangular arrangements of upper stiffeners and lower stiffeners.

Accordingly, the semiconductor package 1000b of FIG. 3A may include an upper package 100a, a lower package substrate 200, and the arrangement of lower stiffeners 300b.

The upper package 100a may include four (4) upper stiffeners 130a, each having a linear fence-shape terminated at opposing ends by a chamfered 45° angle. Thus, corner portions of the arrangement of upper stiffeners may be characterized by corner-opposing (or facing) ends of two different upper stiffeners, wherein inside edges of the opposing upper stiffeners 130a are shorter and outside edges of the opposing upper stiffeners 130a are longer. Here, the corner-opposing upper stiffeners 130a may remain spaced apart from one another.

The arrangement of lower stiffeners 300b may be similarly configured to include four (4) lower stiffeners, each having a linear fence-shape terminated at opposing ends by a chamfered 45° angle. Thus, corner portions of the arrangement of lower stiffeners may be characterized by corner-opposing (or facing) ends of two different lower stiffeners, wherein inside edges of the opposing lower stiffeners are shorter and outside edges of the opposing lower stiffeners are longer. Here, the corner-opposing lower stiffeners may remain spaced apart from one another.

Referring to FIG. 3B, the semiconductor package 1000c may include an arrangement of four (4) lower stiffeners 300c, each having a fence portion and an angular-shaped cover portion extending horizontally inward from a corresponding outer edge of a fence portion. Thus, a combination of the cover portions associated with the lower stiffeners 300c may cover a substantial portion of the lower package substrate 200, excepting a central portion mounting the first semiconductor device 125.

In some embodiments, at least a portion of a lower surface of each angularly-shaped cover portion of the lower stiffeners 300c may contact (e.g., be adhered to using the second adhesive layer 320) at least a portion of an upper surface of a corresponding one of the upper stiffeners 130a.

FIGS. 4A to 4E are cross-sectional views illustrating semiconductor packages 1000d, 1000e, 1000f, and 1000g— each including a dual stiffener—according to embodiments of the inventive concept. Only materials differences between previously presented embodiments (e.g., FIGS. 1A to 1C, 2A, 2B, 3A and 3B) will be highlighted.

Figure 4A:
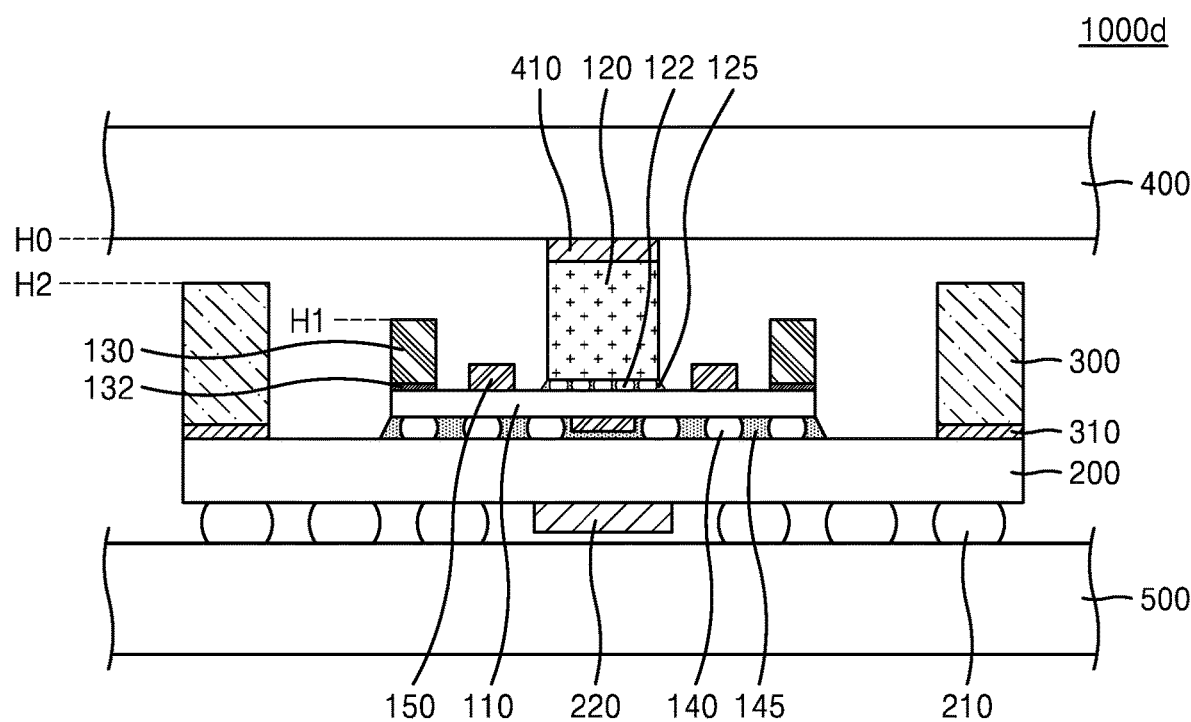
FIGS. 4A, 4B, 4C, 4D and 4E (collectively, "FIGS. 4A to 4E") are respective cross-sectional views illustrating various semiconductor packages including a dual stiffener according to embodiments of the inventive concept.

Referring to FIG. 4A, the semiconductor package 1000d may include the upper package 100, the lower package substrate 200, the lower stiffener 300, a heat sink 400 and a system board 500. Here, the upper package 100, the lower package 200 and the lower stiffener 300 may be substantially the same as described in relation to FIG. 1A.

However, the semiconductor package 1000d may further include the heat sink 400 to more effectively exhaust (e.g., conduct, transfer and/or radiate) heat generated by the first semiconductor chip 120 from the upper package 100. The heat sink 400 may be implemented from one or more thermally conductive material(s) providing relatively high thermal conductivity, for example. For example, the heat sink 400 may include one or more metal(s) such as Cu or aluminum (Al), a carbon-containing material such as graphene, graphite or carbon nanotube, etc. The heat sink 400 may include a single metal layer or multiple (e.g., stacked) metal layers. In some embodiments, the heat sink 400 may be replaced or supplemented by a heat pipe provide within the semiconductor package 1000d.

In some embodiments, the heat sink 400 may directly contact the TIM layer 410 disposed on the upper surface of the first semiconductor chip 120. Here, the TIM layer 410 may include thermally conductive and electrically insulating material(s). For example, the TIM layer 410 may include at least one of a polymer, an epoxy, metal powder (e.g., Ag or Cu), thermal grease, white grease, etc.

In some embodiments, a first "height" (or level measured e.g., in the vertical direction) H0 for the upper surface of the TIM layer 410 may be greater than a second height H1 of the upper surface of the upper stiffener 130, and greater than, less than or equal to a third height H2 of the upper surface of the lower stiffener 300. If the first height H0 is greater than both the second height H1 and the third height H2 (as shown in FIG. 4A), a lower surface of the heat sink 400 may be substantially flat. Accordingly, the upper surface of the upper stiffener 130 and the upper surface of the lower stiffener 300 may be separated from the flat, lower surface of the heat sink 400.

In some embodiments, the second height H1 of the upper stiffener 130 may be less than the third height H2 of the lower stiffener 300.

The system board 500 mounting the lower package substrate 200 may be a main board or a mother board. The system board may be implemented using PCB including an interface capable of connecting various conventionally understood components (not shown), such as a central processing unit (CPU), a random access memory (RAM), a read-only memory (ROM) and/or peripheral apparatus(es). In some embodiments, the semiconductor package 1000d may include the system board 500 substantially implementing an ARM server.

Thus, in the semiconductor package 1000d of FIG. 4A, the heat sink 400 directly contacts the upper surface of the first semiconductor chip 120 through the TIM layer 410 so that thermal transfer characteristics on a system level may be improved. By way of comparative example, certain conventional semiconductor packages—in order to protect the SoC from external shock prevent warpage in the semiconductor package—include a lid type heat-slug which provides inferior thermal transfer characteristics.

Figure 4B:
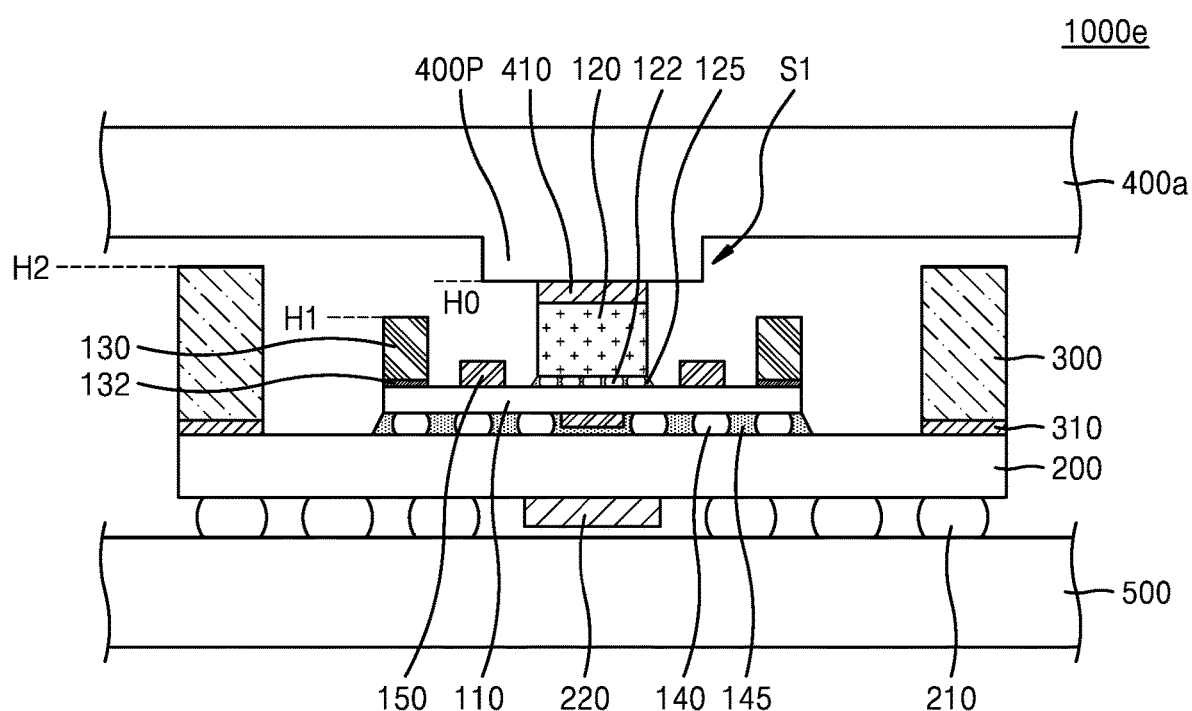

In contrast to the embodiment of FIG. 4A, the semiconductor package 1000e of FIG. 4B may include the lower stiffener 300 having a third height H2 greater than the first height H0 of the TIM layer 410 disposed on the first semiconductor chip 120. Further the second height H1 of the upper surface of the upper stiffener 130 may be less than the third height H2. With this configuration, the heat sink 400a may include a single-step, stepped-down center portion 400P contacting the first semiconductor chip 120 through the TIM layer 410. Thus, at least a portion of the lower surface of the heat sink 400a may thermally contact the first semiconductor chip 120, and yet the respective upper surfaces of the upper stiffener 130 and the lower stiffener 300 may remain separated from the single-step, stepped-down center portion 400P of the lower surface of the heat sink 400a. In this regard, the terms, "thermally contacts" or "thermally contacting" denote a direct contact or a contact through one or more intervening layers between two elements (or surfaces) allowing (or facilitating) a transfer of thermal energy.

Figure 4C:
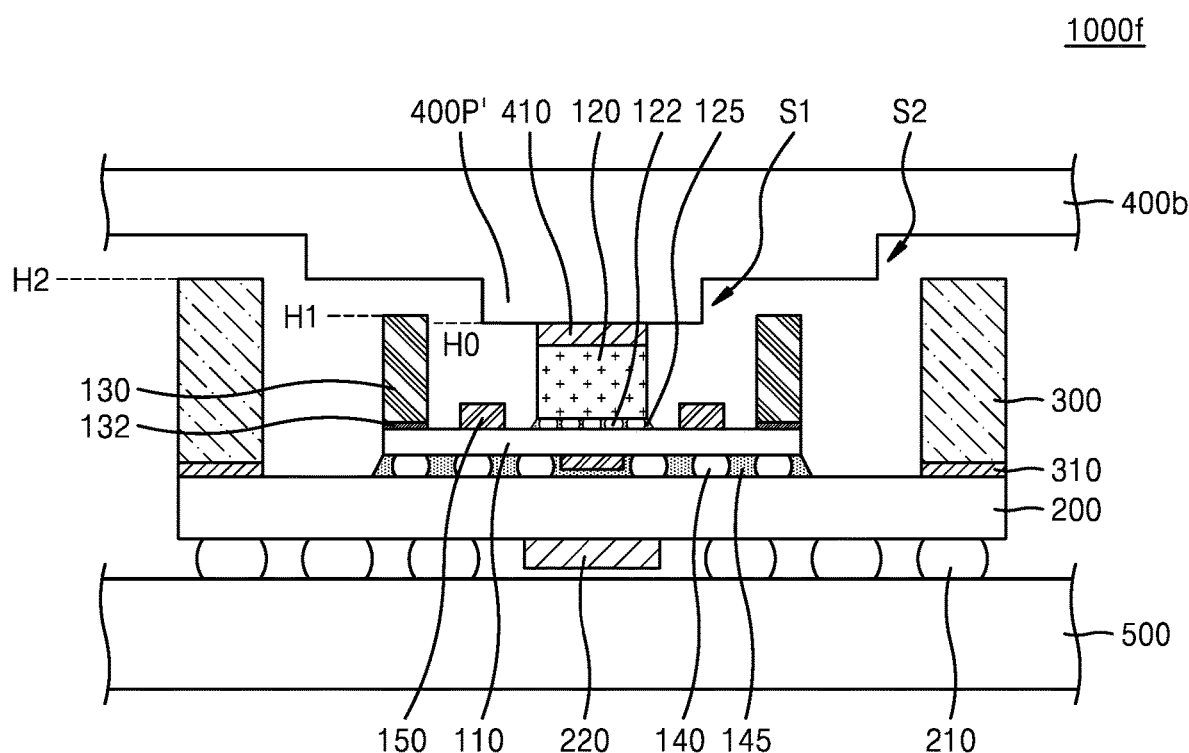

In contrast to the embodiment of FIG. 4B, the semiconductor package 1000f of FIG. 4C may include the lower stiffener 300 having a third height H2 greater than a first height H0 of the upper surface of the TIM layer 410 and a second height H1 of the upper surface of the upper stiffener 130. Further the second height H1 of the upper surface of the upper stiffener 130 may be greater than the first height H0. With this configuration, the heat sink 400a may include a two-step (lower step S1 and upper step S2), stepped-down center portion 400P', wherein the lower step portion S1 of the two-step, stepped-down center portion 400P' contacts the first semiconductor chip 120 through the TIM layer 410. Thus, at least a portion of the lower surface of the heat sink 400b may thermally contact the first semiconductor chip 120, and yet the respective upper surfaces of the upper stiffener 130 and the lower stiffener 300 may remain separated from the two-step, stepped-down center portion 400P' of the lower surface of the heat sink 400b.

Figure 4D:
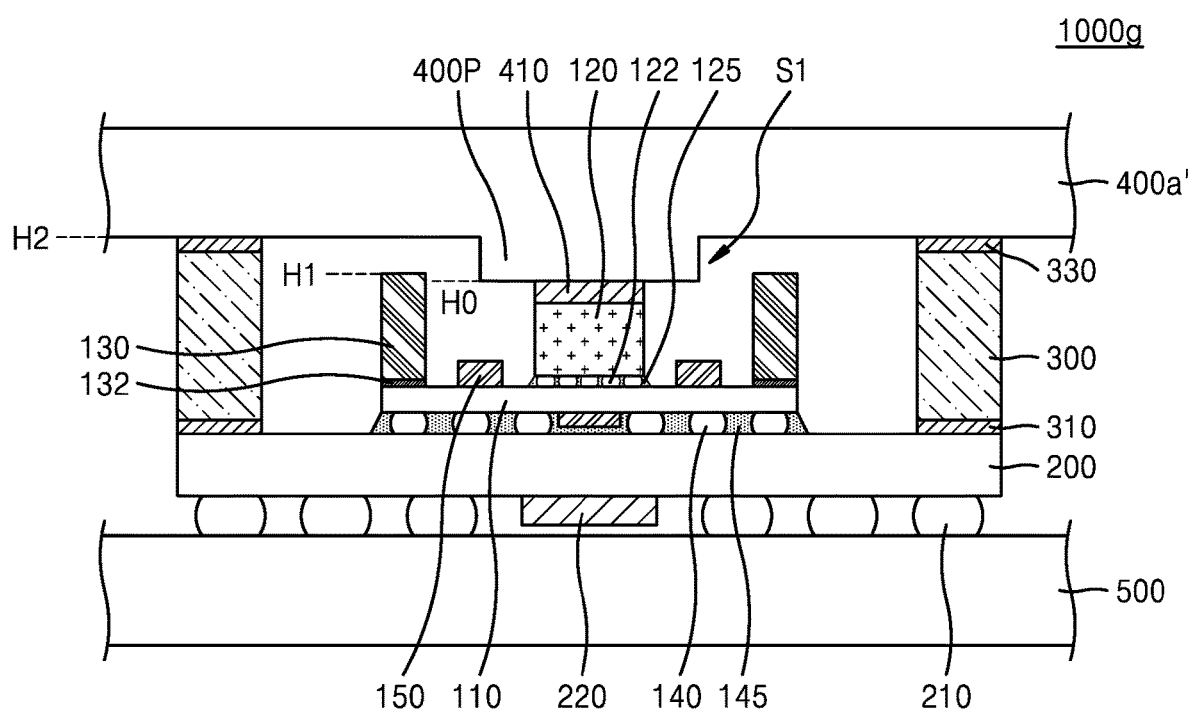

In contrast to the embodiment of FIG. 4B, the semiconductor package 1000g of FIG. 4D may include the lower stiffeners 300 having a third height H2 greater than the first height H0 of the TIM layer 410 disposed on the first semiconductor chip 120. Further the second height H1 of the upper surface of the upper stiffener 130 may be less than the third height H2. With this configuration, a heat sink 400a' may include a single-step, stepped-down center portion 400P contacting the first semiconductor chip 120 through the TIM layer 410. Further, respective outer portions of the heat sink 400a' may contact upper surface portions of the lower stiffeners 300 through a third adhesive layer 330. Thus, at least an inner portion of the lower surface of the heat sink 400a may thermally contact the first semiconductor chip 120, and one or more outer portions of the heat sink 400a may thermally contact the upper surface of at least one of the lower stiffeners 300.

Figure 4E:
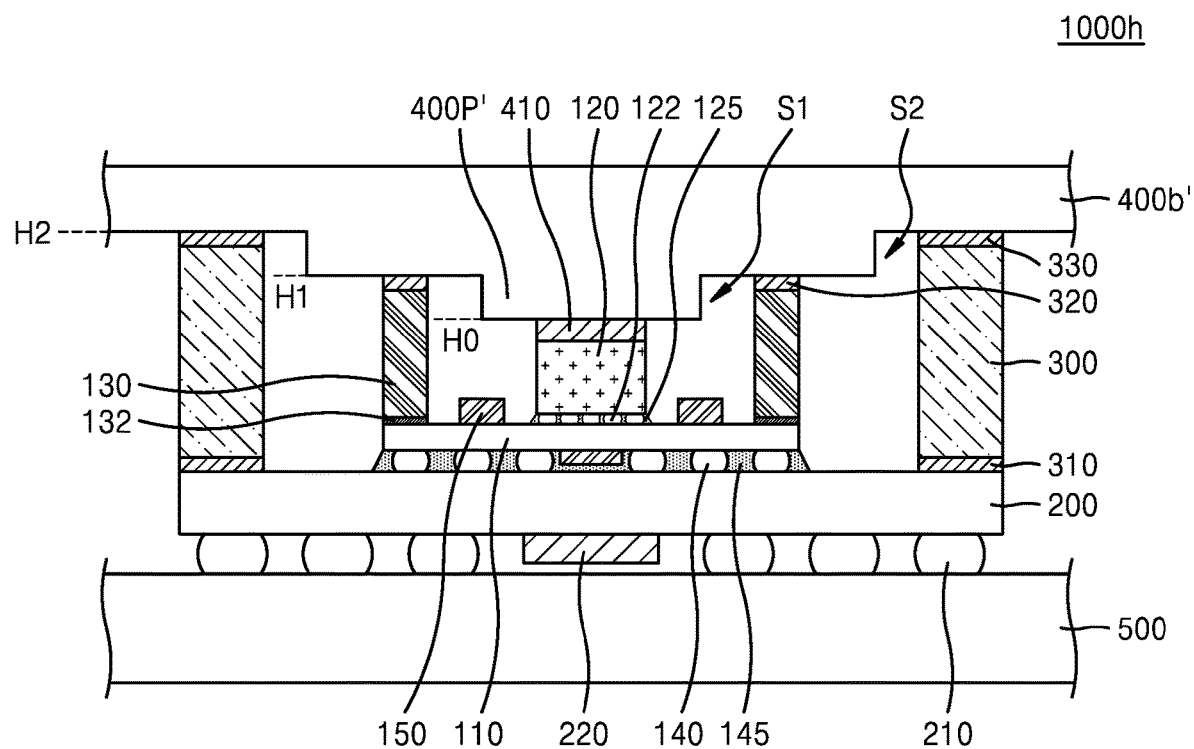

In contrast to the embodiment of FIG. 4C, the semiconductor package 1000h of FIG. 4E may include the lower stiffeners 300 having a third height H2 greater than a first height H0 of the upper surface of the TIM layer 410 and a second height H1 of the upper surface of the upper stiffener 130. Further the second height H1 of the upper surface of the upper stiffener 130 may be greater than the first height H0. With this configuration, a heat sink 400b' may include a two-step (lower step S1 and upper step S2), stepped-down center portion 400P', wherein the lower step portion S1 of the two-step, stepped-down center portion 400P' contacts the first semiconductor chip 120 through the TIM layer 410, one or more of the upper step portion S2 of the two-step, stepped-down center portion 400P' contacts at least one upper surface of the upper stiffeners 130 through a second adhesive layer 320, and one or more outer portions of the heat sink 400b' may contact upper surface portions of the lower stiffeners 300 through a third adhesive layer 330. Thus, at least a portion of the lower surface of the heat sink 400b' may thermally contact the first semiconductor chip 120, one or more outer portions of the heat sink 400b' may thermally contact the upper surface of at least one of the upper stiffeners 130, and one or more outer portions of the heat sink 400a may thermally contact the upper surface of at least one of the lower stiffeners 300.

Thus, in relation to the embodiments of FIGS. 4A to 4E, semiconductor packages according to embodiments of the inventive concept may include a heat sink with a flat lower surface; a heat sink having a lower surface including a single-step, stepped-down center portion surrounded by an outer portion, wherein the stepped-down center portion thermally contacts the upper surface of the semiconductor chip, and the outer portion thermally contacts at least one upper surface portion of the lower stiffener through a first adhesive layer; and a heat sink including a lower surface including a two-step, stepped-down center portion including a lower step portion and an upper step portion surrounded by an outer portion, wherein the first step portion thermally contacts the upper surface of the semiconductor chip, the second step portion thermally contacts at least one upper surface portion of the upper stiffener, and the outer portion thermally contacts an upper surface of the lower stiffener.

Figure 5A:
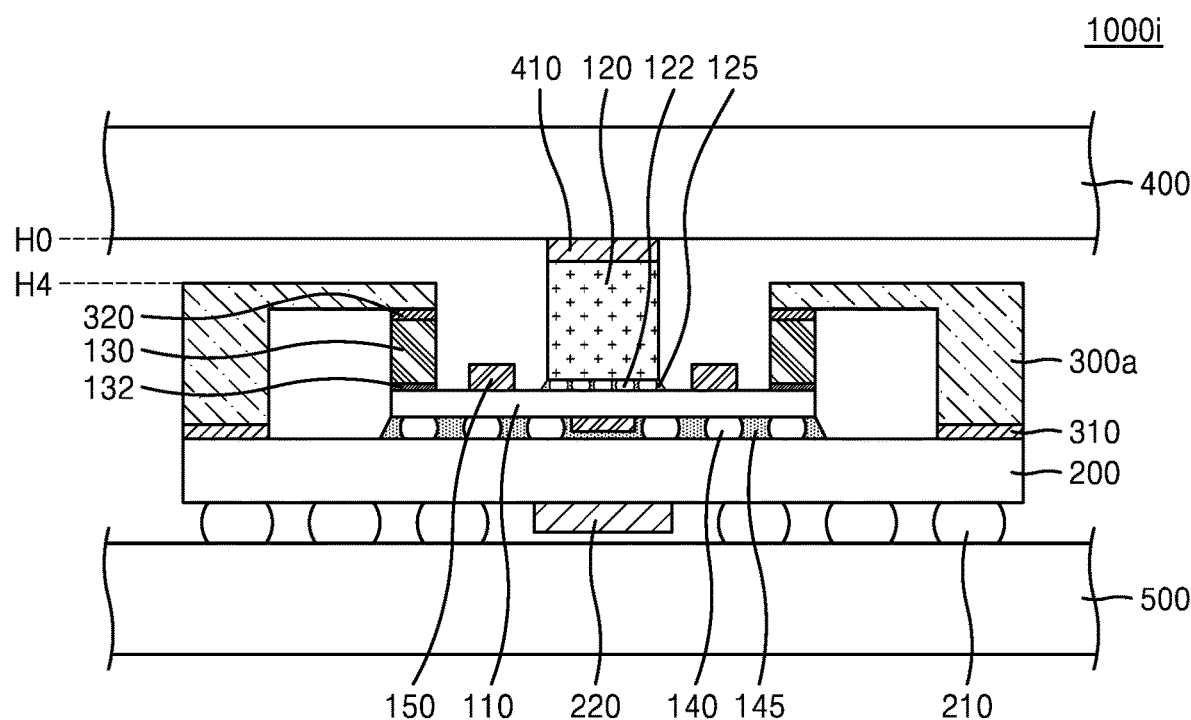
FIGS. 5A, 5B and 5C (collectively, "FIGS. 5A to 5C") are respective cross-sectional views illustrating various semiconductor packages including a dual stiffener according to embodiments of the inventive concept.
Figure 5B:
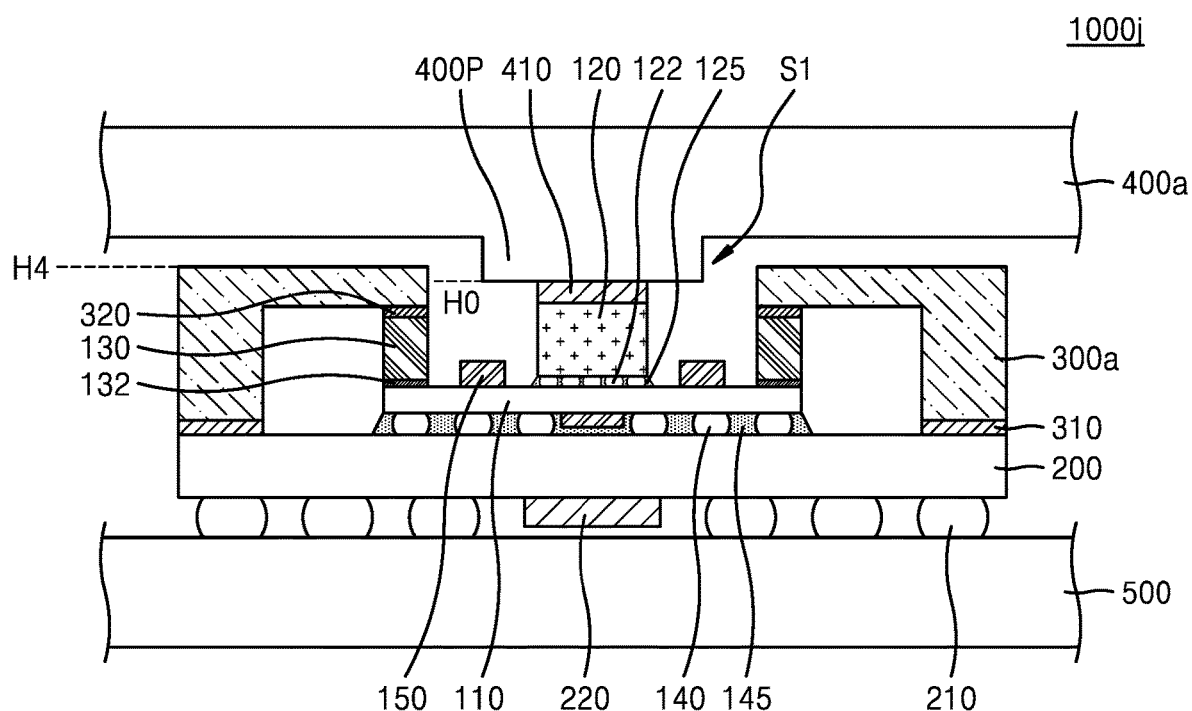
Figure 5C:
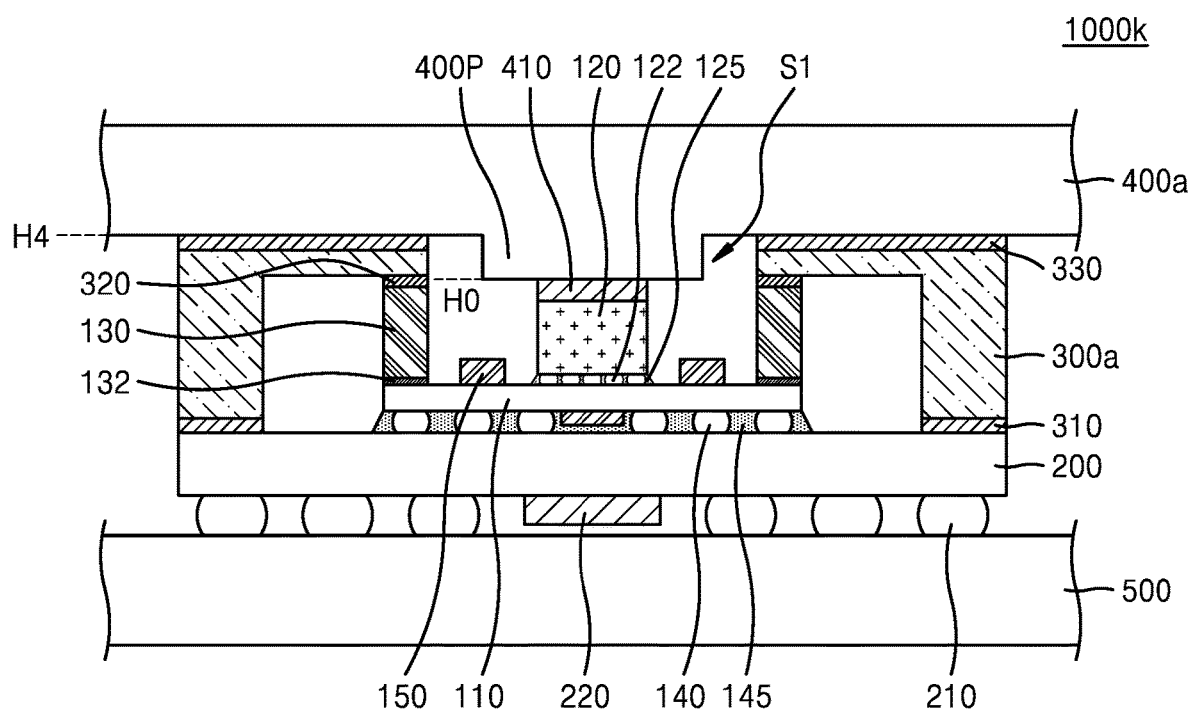

FIGS. 5A, 5B and 5C are respective cross-sectional views illustrating semiconductor packages 1000i, 1000j, and 1000k—each including a dual stiffener—according to embodiments of the inventive concept. Only materials differences between previously presented embodiments (e.g., FIGS. 1A to 1C, 2A, 2B, 3A, 3B and 4A to 4E) will be highlighted.

Referring to FIG. 5A, the semiconductor package 1000i differs from the semiconductor package 1000d of FIG. 4A in the structure of a lower stiffener 300a. Here, the lower stiffener 300a may have a structure substantially the same as the lower stiffener 300a of FIG. 2B. That is, the lower stiffener 300a may include a fence portion and a cover portion contacting the upper surface of the upper stiffener 130.

In this regard, an upper surface of the lower stiffener 300a may have a fourth height H4 less than the first H0 of the TIM layer 410 on the first semiconductor layer 120. Accordingly, a lower surface of a heat sink 400 may be flat, and an upper surface of the lower stiffener 300a may be spaced apart from the flat lower surface of the heat sink 400.

Alternately, if the fourth height H4 of the upper surface of the lower stiffener 300a is equal to the first height H0, the upper surface of the lower stiffener 300a may contact the flat lower surface of the heat sink 400 (e.g., through a thermally conducting adhesive).

Referring to FIG. 5B, the semiconductor package 1000j differs from the semiconductor package 1000e of FIG. 4B in the structure of a lower stiffener 300a. Here, the lower stiffener 300a may have a structure substantially similar to that of the lower stiffener 300a of FIG. 2B. That is, the lower stiffener 300a may include a fence portion and a cover portion contacting the upper surface of the upper stiffener 130.

Assuming that the upper surface of the lower stiffener 300a has a fourth height H4 greater than the first height H0 of the TIM layer 410, a heat sink 400a may include a single-step, stepped-down portion 400P contacting the first semiconductor chip 120 through the TIM layer 410, whereas the respective upper surfaces of the upper stiffener 130 and the lower stiffener 300a remain spaced apart from the lower surface of the single-step, stepped-down heat sink 400a.

Referring to FIG. 5C, the semiconductor package 1000k may be substantially similar to the semiconductor package 1000j of FIG. 5B, except the single-step, stepped-down portion 400P of the heat sink 400a is configured in relation to the fourth height H4 and the first height H0 such that the lower surface of the heat sink 400a thermally contacts both the upper surface of the first semiconductor chip 120 through the TIM layer 410 and the upper surface of the lower stiffener 300a through the third adhesive later 330.

From the foregoing, those skilled in the art will appreciate that heat sink(s) used in relation to semiconductor packages according to embodiments of the inventive concept may be variously designed in relation to the upper surfaces of the first semiconductor chip 120, upper stiffeners 130 and/or lower stiffeners 300 (300a). Of further note, the routine testing of semiconductor packages often requires the temporary application of a so-called "test pusher" to the semiconductor packages. In this regard, a lower surface of a test pusher may be similarly disposed to contact points on upper surfaces of various components of a semiconductor package being tested (e.g., semiconductor packages 1000d to 1000k of FIGS. 4A-4E and 5A to 5C). That is, in relation to at least the first semiconductor chip 120, the upper stiffener 130, and the lower stiffeners 300 and 300a, the test pusher may be similarly designed.

Figure 6A:
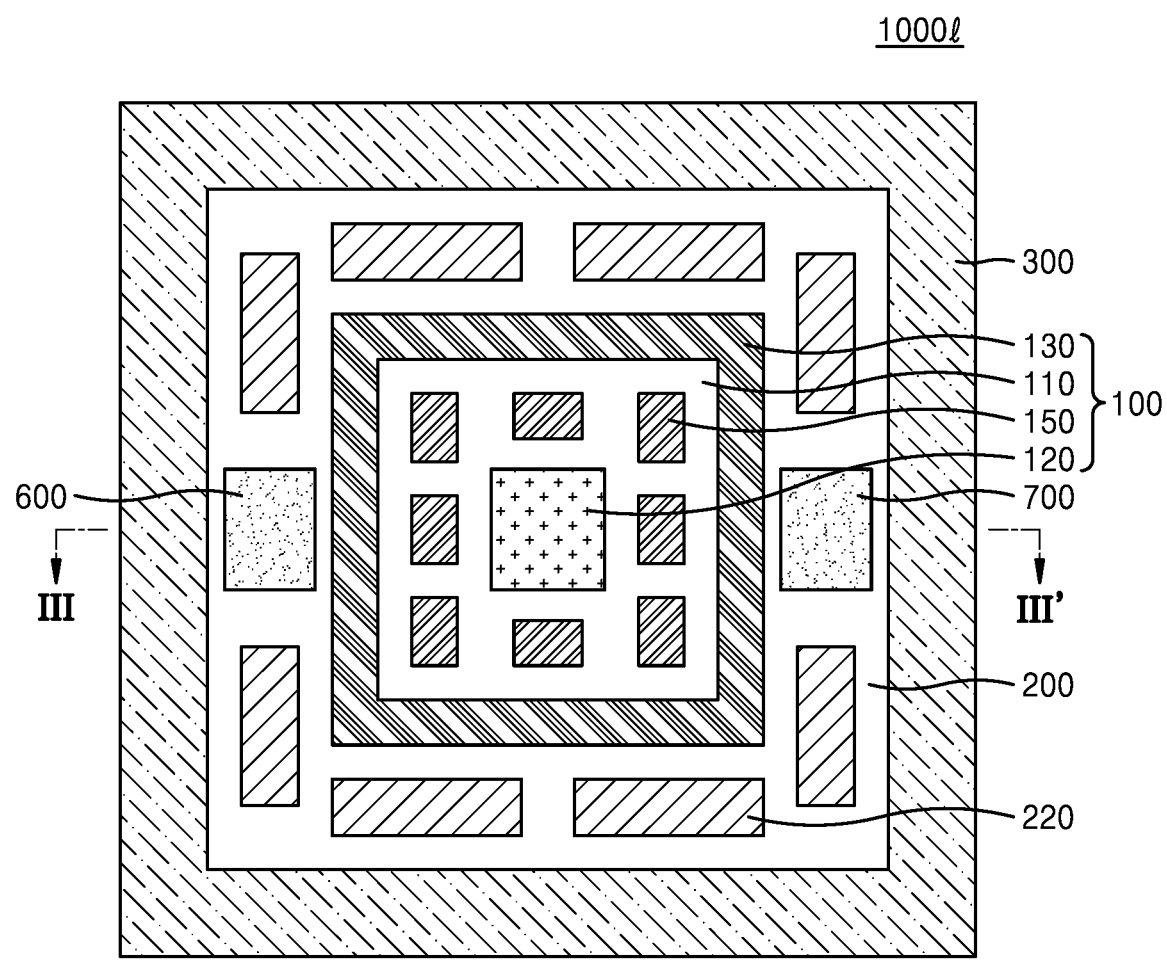
FIG. 6A is a plan view and FIG. 6B is a cross-sectional view; collectively
Figure 6B:
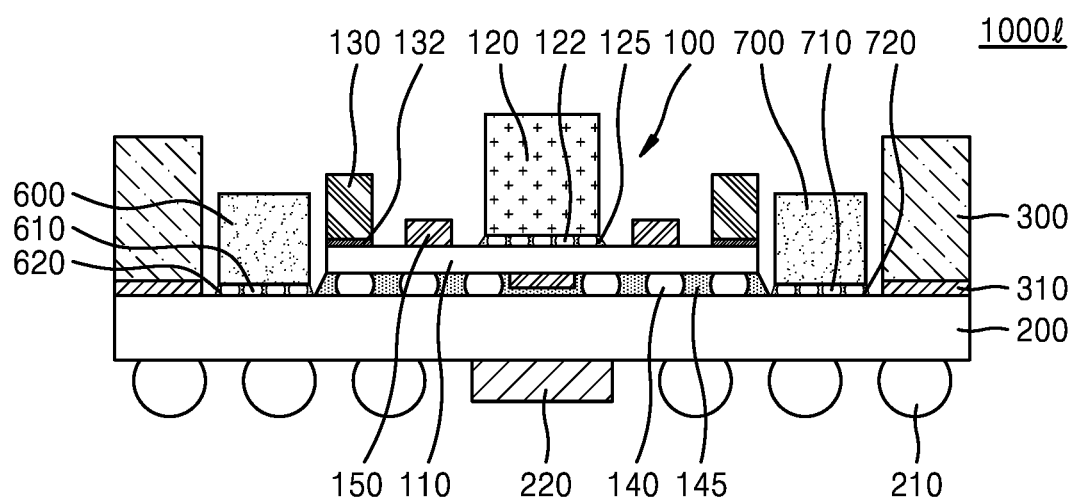

FIG. 6A is a plan view of a semiconductor package 10001 including a dual stiffener according to embodiments of the inventive concept, and FIG. 6B is a cross-sectional view taken along the line III-III' of FIG. 6A. Only materials differences between previously presented embodiments (e.g., FIGS. 1A to 1C, 2A, 2B, 3A, 3B, 4A to 4E and 5A to 5C) will be highlighted.

Referring to FIGS. 6A and 6B, the semiconductor package 10001 differs from the semiconductor package 1000 of FIG. 1A in that a first package 600 and a second package 700 are additionally provided. That is, the semiconductor package 10001 includes the upper package 100, the lower package substrate 200, the lower stiffener 300, a first package 600 and a second package 700. Here, the upper package 100, the lower package substrate 200, and the lower stiffener 300 may be substantially the same as described in relation to FIG. 1A.

However, the first package 600 may be disposed on the lower package substrate 200 between the upper package 100 and the lower stiffener 300. The first package 600 may be mounted on the lower package substrate 200 using fine connection members 610, and an underfill 620 disposed between the first package 600 and the lower package substrate 200 to substantially surround the fine connection members 610.

In some embodiments, a single first package 600 may be mounted on the lower package substrate 200, but the inventive concept is not limited thereto and a plurality of first packages 600 may be variously disposed on the lower package substrate 200.

The first package 600 may include, for example, a memory chip (e.g., a DRAM chip, a static RAM (SRAM) chip, a magnetic RAM (MRAM) chip, and/or a NAND flash memory chip). In some embodiments, the first package 600 may be a DRAM package including one or more DRAM chip(s).

The second package 700 may be disposed on the lower package substrate 200 between the upper package 100 and the lower stiffener 300. For example, the second package 700 may be mounted on the lower package substrate 200 using fine connection members 710 and an underfill 720 disposed between the second package 700 and the lower package substrate 200 to substantially surround the fine connection members 710. One or more second package(s) 700 may be variously mounted on the lower package substrate 200. The second package 700 may include a logic chip (analogous to the first semiconductor chip 120) and/or a memory chip. For example, the second package 700 may be a power management integrated circuit (PMIC) package including a PMIC chip.

Consistent with the foregoing description, the semiconductor package 10001 may further include a system board on which the lower package substrate 200 is mounted and/or a heat sink variously contacting components of the semiconductor package 10001. Different heat sink configurations may be used in relation to different component configurations and heights. (See. e.g., semiconductor packages 1000d to 1000k of FIGS. 4A to 4F and 5A to 5C).

Figure 7A:
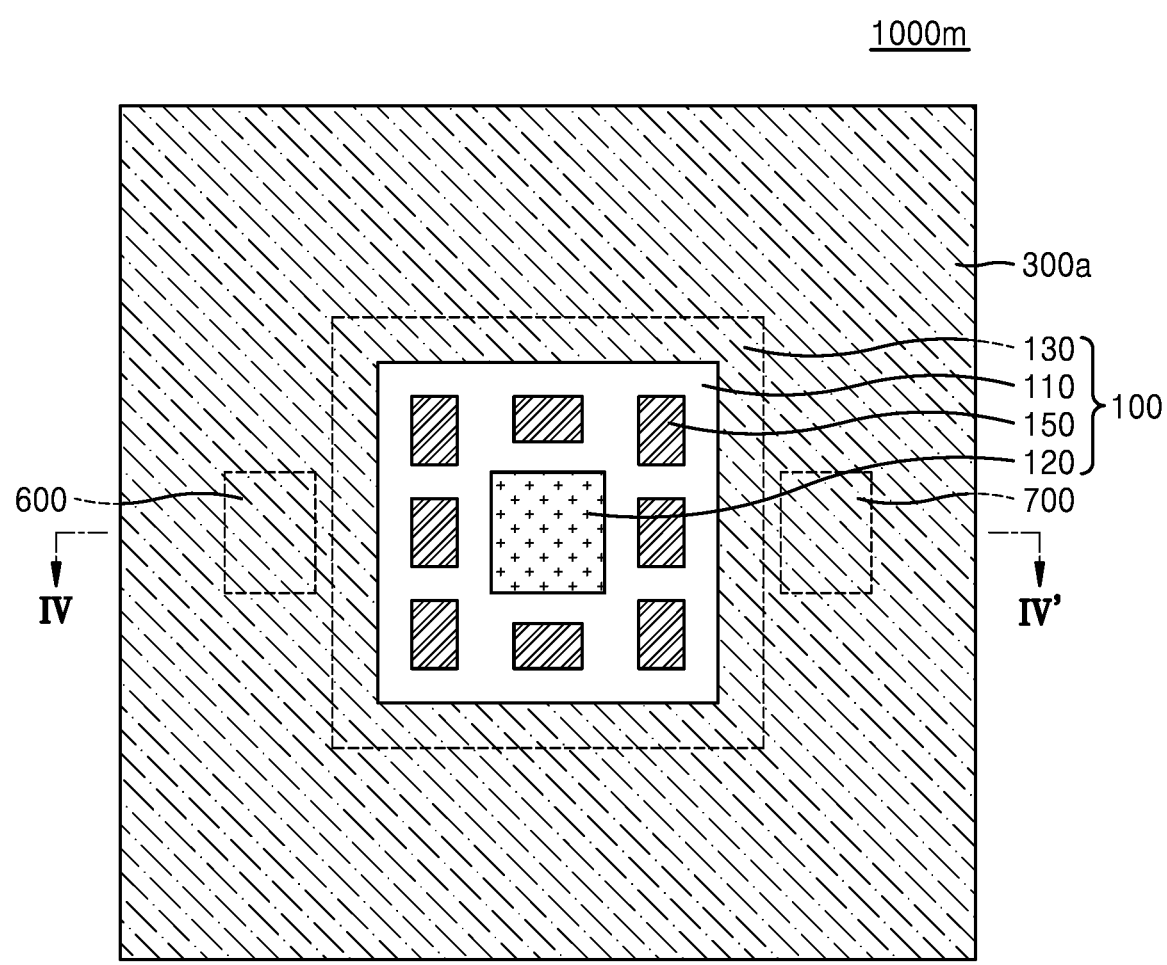
FIG. 7A is a plan view and FIG. 7B is a cross-sectional view; collectively
Figure 7B:
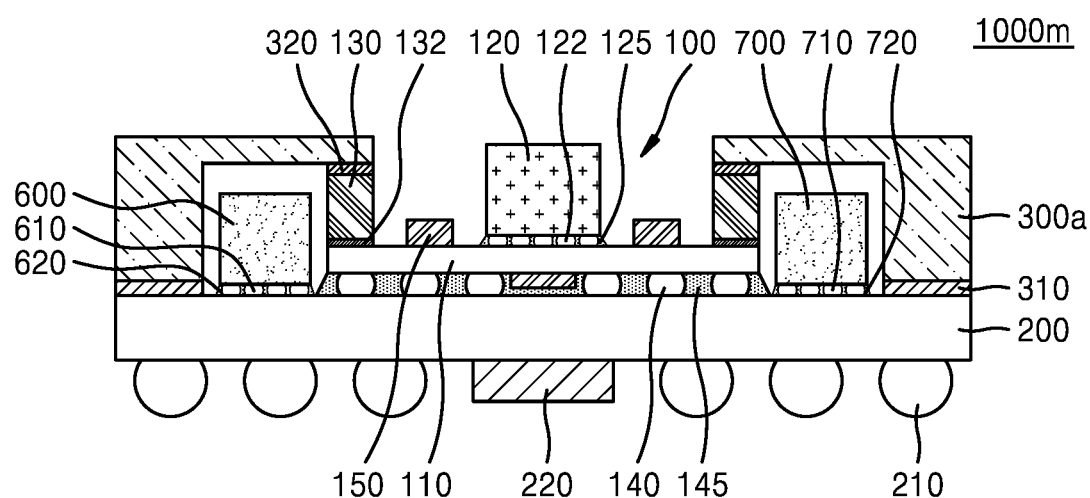

FIG. 7A is a plan view of a semiconductor package 1000m including a dual stiffener according to embodiments of the inventive concept, and FIG. 7B is a cross-sectional view taken along the line IV-IV' of FIG. 7A. Only materials differences between previously presented embodiments (e.g., FIGS. 1A to 1C, 2A, 2B, 3A, 3B, 4A to 4E, 5A to 5C, 6A and 6B) will be highlighted.

Referring to FIGS. 7A and 7B, the semiconductor package 1000m differs from the semiconductor package 1000a of FIG. 2A in that a first package 600 and a second package 700 are additionally provided. That is, the semiconductor package 1000m includes the upper package 100, the lower package substrate 200, the lower stiffener 300, a first package 600 and a second package 700. Here, the upper package 100, the lower package substrate 200, and the lower stiffener 300 may be substantially the same as described in relation to FIG. 2A.

However, the first package 600 may be disposed on the lower package substrate 200 between the upper package 100 and the lower stiffener 300. The first package 600 may be mounted on the lower package substrate 200 using fine connection members 610, and an underfill 620 disposed between the first package 600 and the lower package substrate 200 to substantially surround the fine connection members 610.

In some embodiments, a single first package 600 may be mounted on the lower package substrate 200, but the inventive concept is not limited thereto and a plurality of first packages 600 may be variously disposed on the lower package substrate 200.

The first package 600 may include, for example, a memory chip (e.g., a DRAM chip, a static RAM (SRAM) chip, a magnetic RAM (MRAM) chip, and/or a NAND flash memory chip). In some embodiments, the first package 600 may be a DRAM package including one or more DRAM chip(s).

The second package 700 may be disposed on the lower package substrate 200 between the upper package 100 and the lower stiffener 300. For example, the second package 700 may be mounted on the lower package substrate 200 using fine connection members 710 and an underfill 720 disposed between the second package 700 and the lower package substrate 200 to substantially surround the fine connection members 710. One or more second package(s) 700 may be variously mounted on the lower package substrate 200. The second package 700 may include a logic chip (analogous to the first semiconductor chip 120) and/or a memory chip. For example, the second package 700 may be a power management integrated circuit (PMIC) package including a PMIC chip.

Consistent with the foregoing description, the semiconductor package 1000m may further include a system board on which the lower package substrate 200 is mounted and/or a heat sink variously contacting components of the semiconductor package 10001. Different heat sink configurations may be used in relation to different component configurations and heights. (See. e.g., semiconductor packages 1000d to 1000k of FIGS. 4A to 4F and 5A to 5C).

Figure 8A:
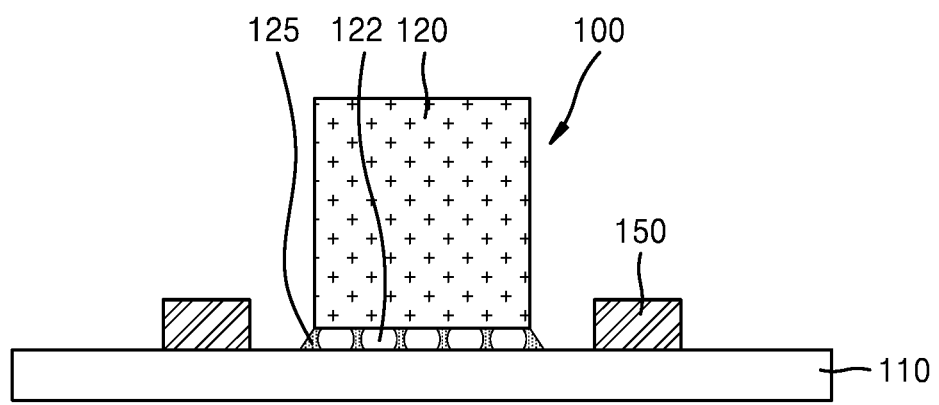
FIGS. 8A, 8B, 8C, 8D, 8E and 8F (collectively, "FIGS. 8A to 8F") are respective cross-sectional views variously illustrating methods of manufacturing semiconductor packages including a dual stiffener according to embodiment of the inventive concept.
Figure 8B:
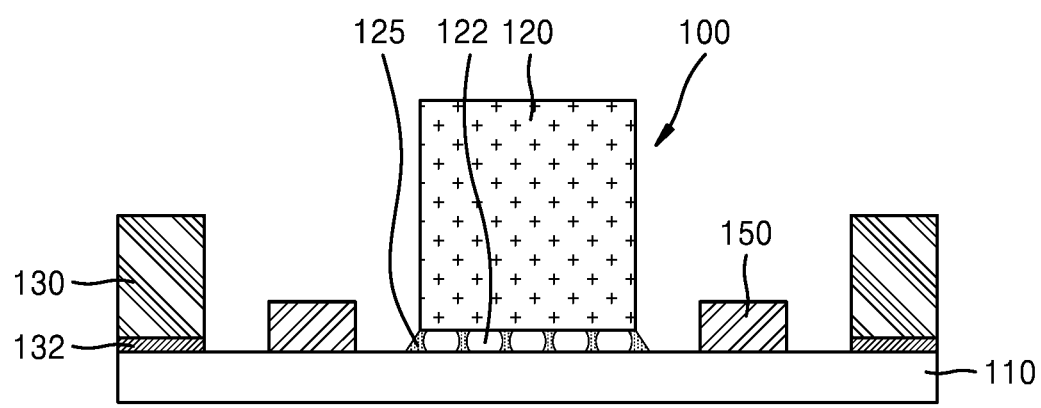
Figure 8C:
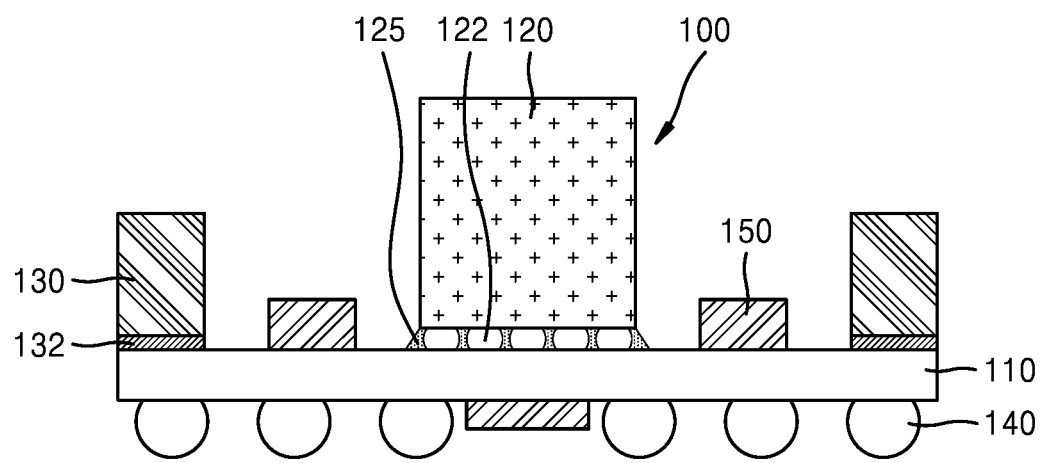

FIGS. 8A to 8F are related, cross-sectional views illustrating in one example a method of manufacturing a semiconductor package including a dual stiffener according to embodiments of the inventive concept. Of note, FIGS. 8A to 8C are drawn to a different scale than FIGS. 8D to 8F. Further, the description associated with FIGS. 8A to 8F draws upon the description associated with FIGS. 1A and 1B.

Referring to FIG. 8A, a first semiconductor chip 120 and passive elements 150 are mounted on the upper package substrate 110. In some embodiments, the first semiconductor chip 120 may be a SoC. Here, in some embodiments, the first semiconductor chip 120 may be flip-chip mounted on the upper package substrate 110 using fine connection members 122. An underfill 125 may be disposed between the first semiconductor chip 120 and the upper package substrate 110 to substantially surround the fine connection members 122.

Referring to FIG. 8B, an upper stiffener 130 is fixed to an outer portion of (e.g., laterally spaced apart from the first semiconductor 120) the upper package substrate 110 using the second adhesive layer 132. The upper stiffener 130 may be rectangular shape (e.g., a square-ring) and may substantially surround the first semiconductor chip 120—being arranged in some embodiments along (or proximate to) an outer edge of the upper package substrate 110. In some embodiments the upper stiffener 130 may include a combination of four (4) linear fence portions—with or without corresponding cover portions. (See, FIGS. 3A and 3B).

Referring to FIG. 8C, first connection members 140 may be attached to a lower surface of the upper package substrate 110. Optionally, additional passive element(s) 150 may be centrally disposed on the lower surface of the upper package substrate 110.

The first connection members 140 may be disposed on the lower surface of the upper package substrate 110 in an array structure and have a pitch no greater than 0.8 mm (e.g., 0.5 mm).

Figure 8D:
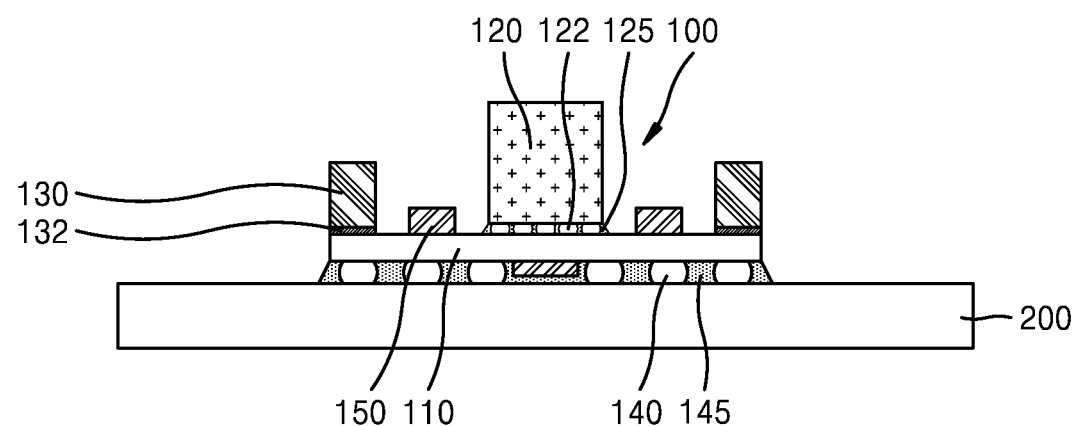

Referring to FIG. 8D, the upper package 100 may be mounted on the lower package substrate 200 using the first connection members 140. An underfill 145 may be disposed between the upper package 100 and the lower package substrate 200 to substantially surround the first connection members 140.

Figure 8E:
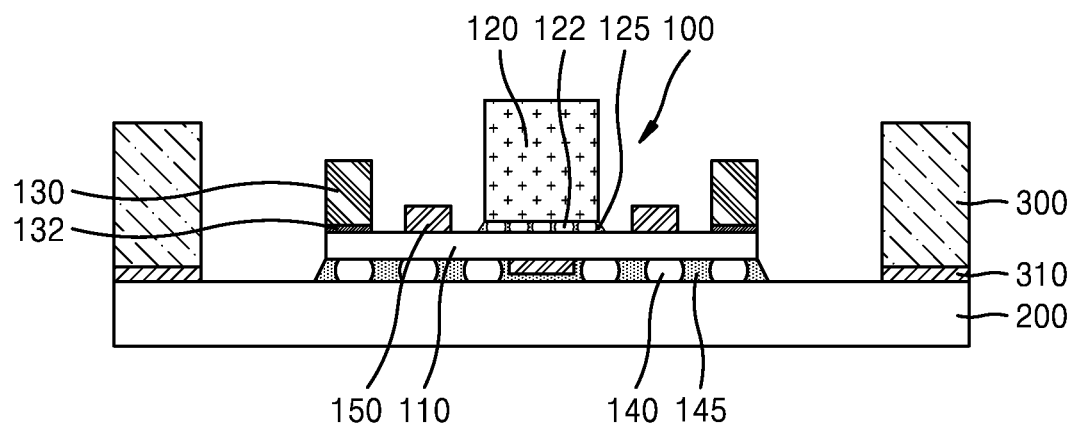

Referring to FIG. 8E, the lower stiffener 300 may be fixed to outer portions of the lower package substrate 200 using the first adhesive 310. The lower stiffener 300 may have a substantially rectangular shape and may substantially surround the upper package 100—being in some embodiments arranged or disposed along the outer edge portions of the lower package substrate 200. In some embodiments, the lower stiffener 300 may be a unitary square ring or a combination of four (4) linear fence portions—with or without corresponding cover portions. (See, FIGS. 3A and 3B).

Figure 8F:
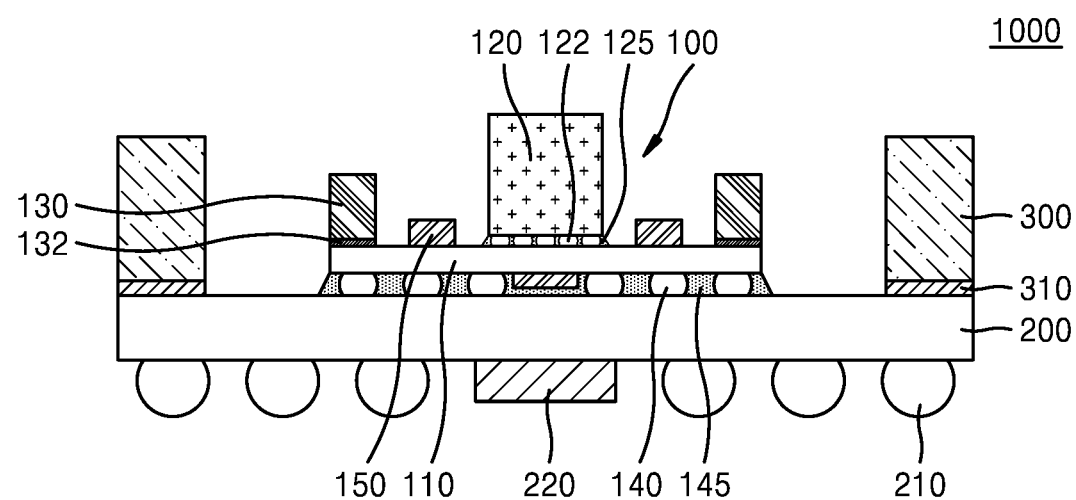

Referring to FIG. 8F, additional passive elements 220 may (optionally) be disposed on a lower surface of the lower package substrate 200. Second connection members 210 may also be disposed on the lower surface of the lower package substrate 200. In some embodiments, the passive elements 220 may be centrally disposed on the lower surface of the lower package substrate 200, and the second connection members 210 may be disposed on the lower surface of the lower package substrate 200 in an array structure. The second connection members 210 may have a pitch ranging from about 0.8 mm to about 1.3 mm (e.g., about 1.0 mm).

In some embodiments analogous to the semiconductor package 1000d of FIG. 4A, the resulting semiconductor package of FIGS. 8A to 8F may be mounted on a system board. Alternately or additionally, a heat sink of various designs may be disposed on the semiconductor package to thermally contact selected upper surfaces of constituent components.

Figure 9A:
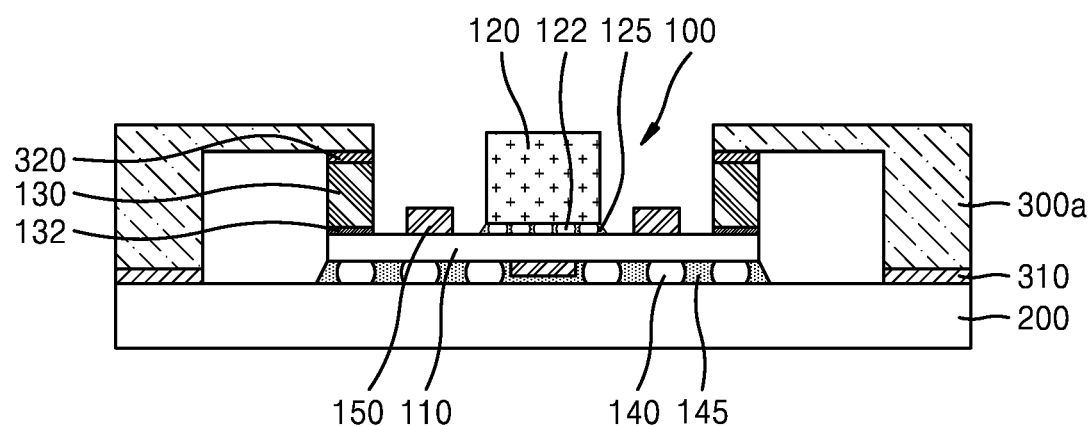
FIGS. 9A and 9B are respective cross-sectional views further illustrating methods of manufacturing semiconductor packages including a dual stiffener according to embodiments of the inventive concept.
Figure 9B:
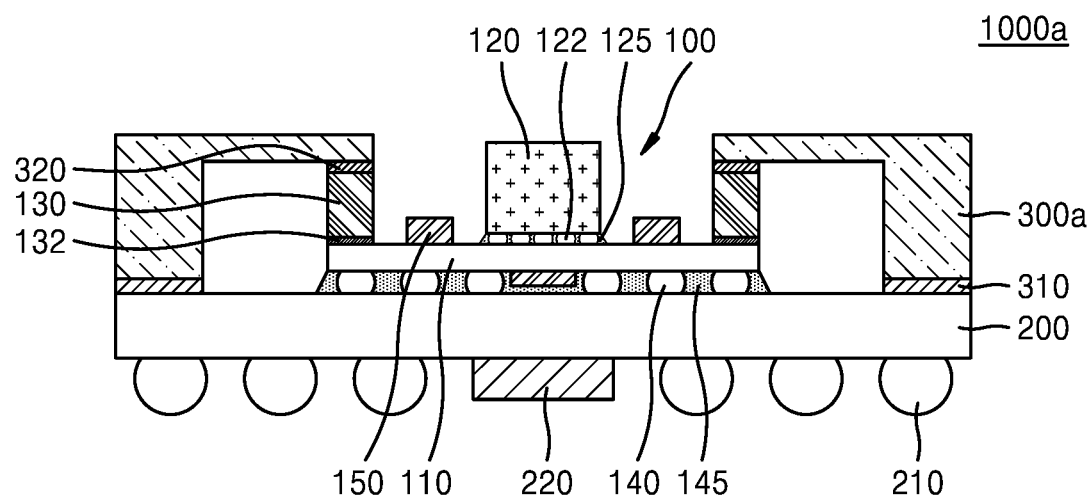

FIGS. 9A and 9B are respective cross-sectional views illustrating possible modifications to the manufacturing method of FIGS. 8A to 8D, further in view of the embodiment illustrated in FIG. 2A.

Referring to FIGS. 2A, 8A to 8D and 9A, the upper package 100 may be flip-chip mounted on the lower package substrate 200 using the first connection members 140. Then, the lower stiffener 300a is fixed to outer portions of the lower package substrate 200 using the first adhesive layer 310, and fixed to the upper surface of the upper stiffener 130 using the second adhesive layer 320. Here, the lower stiffener 300a includes a fence portion 302 and a cover portion 304, as described above.

Referring to FIG. 9B, a passive element 220 may be optionally and centrally disposed on the lower surface of the lower package substrate 200, and the second connection members 210 may also be disposed on the lower surface of the lower package substrate 200 in an array structure. Here, the pitch of the second connection members 210 may be the same as that previously described in relation to FIG. 8F.

From the foregoing, those skilled in the art will appreciate that the manufacturing method of FIGS. 8A to 8F may be further modified to yield the semiconductor package 1000i of FIG. 5A, wherein the resulting semiconductor package 1000a may be mounted in a system board. Further, a heat sink of variable design may be disposed to contact selected upper surfaces of components within the semiconductor package 1000a.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a dual stiffener including an upper stiffener and a lower stiffener;
   an upper package including an upper package substrate, a semiconductor chip centrally mounted on an upper surface of the upper package substrate, and the upper stiffener disposed along an outer edge of the upper package substrate; and
   a lower package substrate that centrally mounts the upper package and includes the lower stiffener disposed on an upper surface of the lower package substrate to surround the upper package substrate; and
   passive elements disposed in at least one of the upper surface of the upper package substrate between the semiconductor chip and the upper stiffener, and a central portion of a lower surface of the lower package substrate.

2. The semiconductor package of claim 1, wherein the upper stiffener is a square-ring having a rectangular cross-section, and
the lower stiffener includes a fence portion having a rectangular cross-section and a cover portion extending horizontally from an upper surface of the fence portion to contact an upper surface of the upper stiffener.

3. The semiconductor package of claim 1, wherein the fence portion of the lower stiffener is a square-ring, and
the upper stiffener and the lower stiffener are laterally spaced apart.

4. The semiconductor package of claim 1, wherein a first area occupied by the upper package substrate is less than a second area occupied by the lower package substrate, and
the upper package substrate includes a core layer disposed between an upper wiring layer and a lower wiring layer, wherein the upper wiring layer and the lower wiring layer are electrically connected through the core layer by a through-via.

5. The semiconductor package of claim 1, wherein the upper package is centrally mounted on the lower package substrate using first connections members having a first pitch, and
the lower package substrate further includes second connection members disposed on a lower surface of the lower package substrate and having a second pitch greater than the first pitch.

6. The semiconductor package of claim 1, further comprising:
at least one of a dynamic random access memory (DRAM) package and a power management integrated circuit (PMIC) package disposed on the upper surface of the lower package substrate between the lower stiffener and the upper package.

7. The semiconductor package of claim 1, further comprising:
a heat sink disposed on the upper package and having a lower surface thermally contacting an upper surface of the semiconductor chip.

8. The semiconductor package of claim 7, wherein the lower surface of the heat sink is flat, and
an upper surface of the upper stiffener and an upper surface of the lower stiffener are separated from the lower surface of the heat sink.

9. The semiconductor package of claim 7, wherein the lower surface of the heat sink includes a single-step, stepped-down center portion surrounded by an outer portion,
the stepped-down center portion thermally contacts the upper surface of the semiconductor chip, and
the outer portion thermally contacts an upper surface of the lower stiffener.

10. The semiconductor package of claim 7, wherein the lower surface of the heat sink includes a two-step, stepped-down center portion having a lower step portion and an upper step portion surrounded by an outer portion,
the lower step portion thermally contacts the upper surface of the semiconductor chip,
the upper step portion thermally contacts an upper surface of the upper stiffener, and
the outer portion thermally contacts an upper surface of the lower stiffener.

11. A semiconductor package comprising:
a dual stiffener including an upper stiffener and a lower stiffener;
an upper package including an upper package substrate, a system on chip (SoC) centrally mounted on an upper surface of the upper package substrate using an upper ball grid array (BGA), and the upper stiffener disposed along an outer edge of the upper package substrate;
a lower package substrate that centrally mounts the upper package using a second BGA and includes the lower stiffener disposed on an upper surface of the lower package substrate to surround the upper package substrate; and
a heat sink disposed on the upper package,
wherein the upper stiffener is a square-ring having a rectangular cross-section,
the lower stiffener includes a fence portion having a rectangular cross-section and a cover portion extending horizontally from an upper surface of the fence portion to contact an upper surface of the upper stiffener, and
the upper stiffener and the lower stiffener are laterally spaced apart.

12. The semiconductor package of claim 11, wherein the heat sink thermally contacts an upper surface of the SoC.

13. The semiconductor package of claim 12, wherein the heat sink includes one of:
a lower surface having flat structure thermally contacting the upper surface of the SoC, wherein an upper surface of the upper stiffener and an upper surface of the lower stiffener are separated from the lower surface of the heat sink;
a lower surface including a single-step, stepped-down center portion surrounded by an outer portion, wherein the stepped-down center portion thermally contacts the upper surface of the SoC, and the outer portion thermally contacts an upper surface of the lower stiffener; and
a lower surface including a two-step, stepped-down center portion surrounded by an outer portion and including a lower step portion and an upper step portion, wherein the lower step portion thermally contacts the upper surface of the SoC, the upper step portion thermally contacts an upper surface of the upper stiffener, and the outer portion thermally contacts an upper surface of the lower stiffener.

14. A semiconductor package comprising:
a dual stiffener including an upper stiffener and a lower stiffener;
an upper package including an upper package substrate, a semiconductor chip centrally mounted on an upper surface of the upper package substrate, and the upper stiffener disposed along an outer edge of the upper package substrate;
a lower package substrate that centrally mounts the upper package and includes the lower stiffener disposed on an upper surface of the lower package substrate to surround the upper package substrate; and
a heat sink disposed on the upper package and including a lower surface thermally contacting an upper surface of the semiconductor chip,
wherein the upper stiffener has a square-ring shape and a rectangular cross-section, and
the lower stiffener has a square-ring shape and includes a fence portion having a rectangular cross-section and a cover portion extending horizontally from an upper surface of the fence portion to contact an upper surface of the upper stiffener.

15. The semiconductor package of claim 14, wherein the lower surface of the heat sink is flat, and
an upper surface of the upper stiffener and an upper surface of the lower stiffener are separated from the lower surface of the heat sink.

16. The semiconductor package of claim 14, wherein the lower surface of the heat sink includes a single-step, stepped-down center portion surrounded by an outer portion, and the stepped-down center portion thermally contacts the upper surface of the semiconductor chip.

17. The semiconductor package of claim 14, wherein the lower surface of the heat sink includes a single-step, stepped-down center portion surrounded by an outer portion, the stepped-down center portion thermally contacts the upper surface of the semiconductor chip, and the outer portion thermally contacts an upper surface of the cover portion of the lower stiffener.

18. The semiconductor package of claim 14, wherein the fence portion includes opposing ends, wherein each of the opposing ends is chamfered at a 45° angle, and the cover portion has an angular shape extending horizontally inward from an outer edge of the fence portion.

\* \* \* \* \*